United States Patent
Do et al.

(10) Patent No.: US 10,381,537 B2
(45) Date of Patent: Aug. 13, 2019

(54) LIGHT EMITTING DEVICE AND LIGHTING DEVICE HAVING SAME

(71) Applicant: LG INNOTEK CO., LTD., Seoul (KR)

(72) Inventors: Hyoung Seok Do, Seoul (KR); Hwan Hee Jeong, Seoul (KR); Chong Wook Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/774,896

(22) PCT Filed: Nov. 9, 2016

(86) PCT No.: PCT/KR2016/012857
§ 371 (c)(1),
(2) Date: May 9, 2018

(87) PCT Pub. No.: WO2017/082623
PCT Pub. Date: May 18, 2017

(65) Prior Publication Data
US 2018/0351059 A1     Dec. 6, 2018

(30) Foreign Application Priority Data
Nov. 10, 2015 (KR) .......................... 10-2015-0157412

(51) Int. Cl.
*H01L 33/60* (2010.01)
*H01L 33/62* (2010.01)
(Continued)

(52) U.S. Cl.
CPC .............. *H01L 33/62* (2013.01); *H01L 23/62* (2013.01); *H01L 25/167* (2013.01); *H01L 33/36* (2013.01);
(Continued)

(58) Field of Classification Search
None
See application file for complete search history.

(56) References Cited

U.S. PATENT DOCUMENTS

| 2010/0165635 A1* | 7/2010 | Chen | F21V 5/04 |
|---|---|---|---|
| | | | 362/307 |
| 2012/0056217 A1* | 3/2012 | Jung | H01L 25/0753 |
| | | | 257/89 |

(Continued)

FOREIGN PATENT DOCUMENTS

| JP | 2014-116411 A | 6/2014 |
|---|---|---|
| JP | 2015-115532 A | 6/2015 |

(Continued)

OTHER PUBLICATIONS

International Search Report (PCT/ISA/210) issued in PCT/KR2016/012857; dated Feb. 24, 2017.

*Primary Examiner* — Bo B Jang
(74) *Attorney, Agent, or Firm* — Birch, Stewart, Kolasch & Birch, LLP

(57) ABSTRACT

A light-emitting element disclosed according to an embodiment may comprise: a substrate comprising a body, a plurality of lead electrodes arranged over the body in a first axial direction, and a heat-radiating frame and a plurality of lead frames arranged below the body in a second axial direction; and a light-emitting chip arranged on a first lead electrode, which is arranged in the central area of the body among the plurality of lead electrodes, and electrically connected with the plurality of lead electrodes. The plurality of lead electrodes have a large length in the second axial direction, the heat-radiating frame is arranged in the central area below the body, and the heat-radiating frame and the plurality of lead frames have a large length in the first axial direction and may vertically overlap with the plurality of lead electrodes.

17 Claims, 10 Drawing Sheets

(51) Int. Cl.

|  |  |  |
|---|---|---|
| *H01L 33/64* | (2010.01) |
| *H01L 33/36* | (2010.01) |
| *H01L 33/50* | (2010.01) |
| *H01L 33/58* | (2010.01) |
| *H01L 23/62* | (2006.01) |
| *H01L 25/16* | (2006.01) |
| *H01L 33/54* | (2010.01) |

(52) U.S. Cl.
CPC ............ *H01L 33/50* (2013.01); *H01L 33/505* (2013.01); *H01L 33/58* (2013.01); *H01L 33/60* (2013.01); *H01L 33/64* (2013.01); *H01L 33/642* (2013.01); *H01L 33/644* (2013.01); *H01L 33/54* (2013.01); *H01L 2224/32225* (2013.01); *H01L 2224/48091* (2013.01); *H01L 2224/48227* (2013.01); *H01L 2224/73265* (2013.01)

(56) References Cited

U.S. PATENT DOCUMENTS

| 2012/0181555 A1 | 7/2012 | Yoo et al. |
| 2014/0070249 A1 | 3/2014 | Yoon et al. |

FOREIGN PATENT DOCUMENTS

| KR | 10-2011-0080474 A | 7/2011 |
| KR | 10-2012-0083080 A | 7/2012 |
| KR | 10-2012-0127184 A | 11/2012 |
| KR | 10-2013-0068725 A | 6/2013 |
| KR | 10-2014-0035211 A | 3/2014 |

\* cited by examiner

[FIGURE 1]
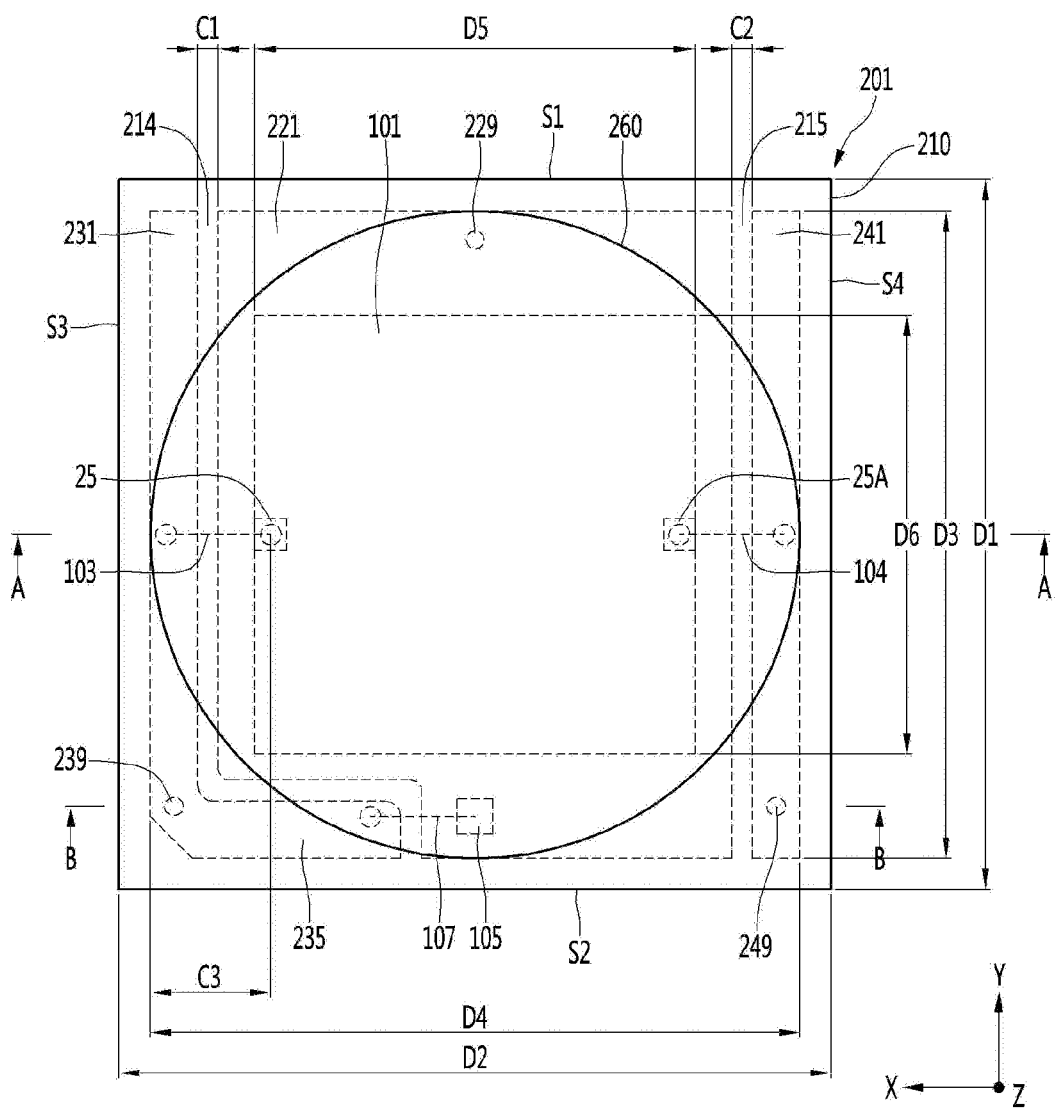

[Figure 2]
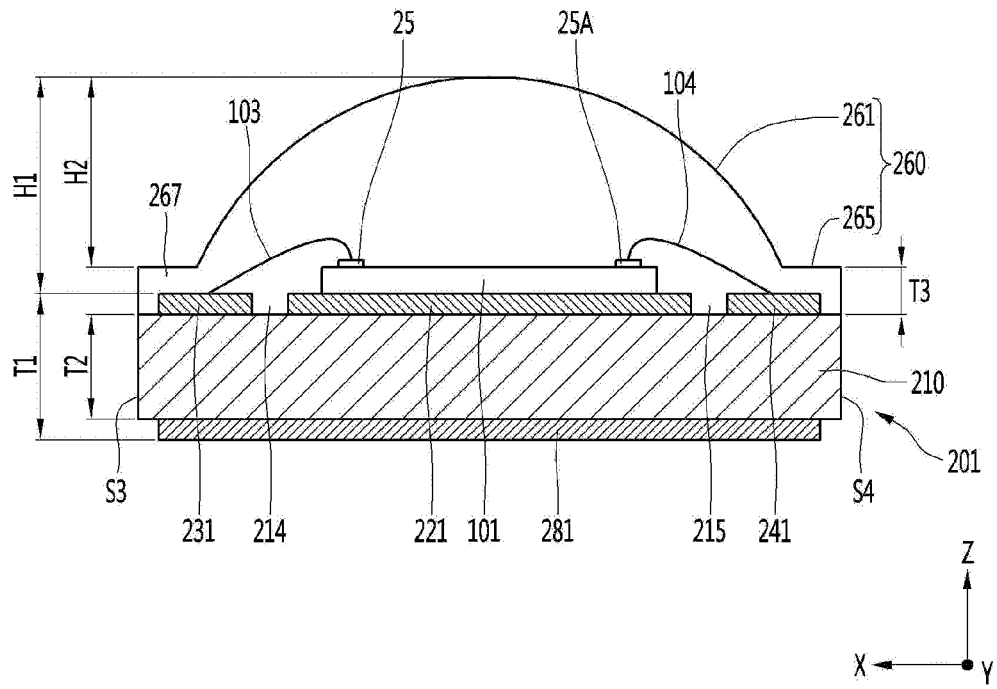
[Figure 3]
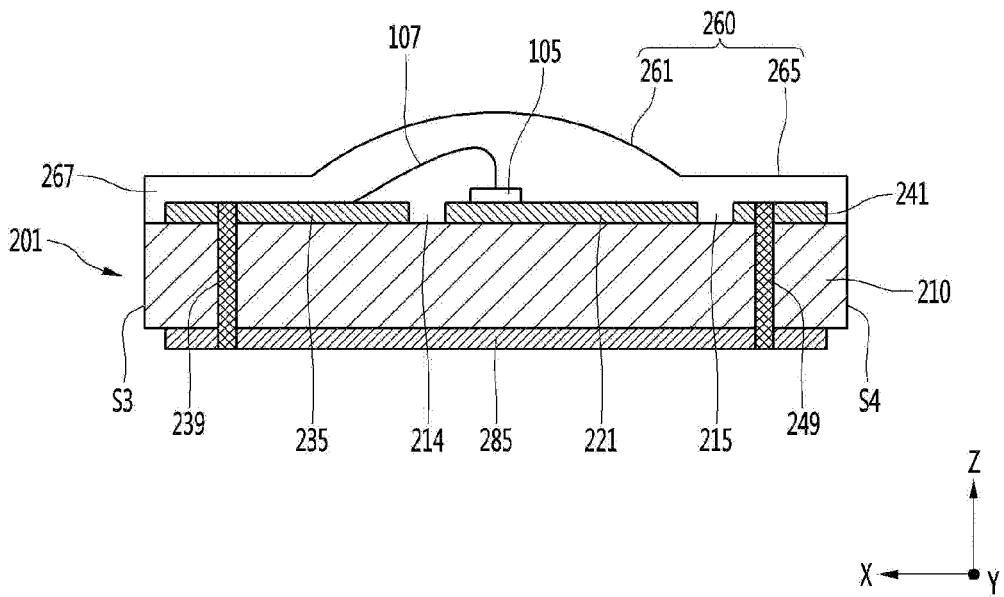

[Figure 4]
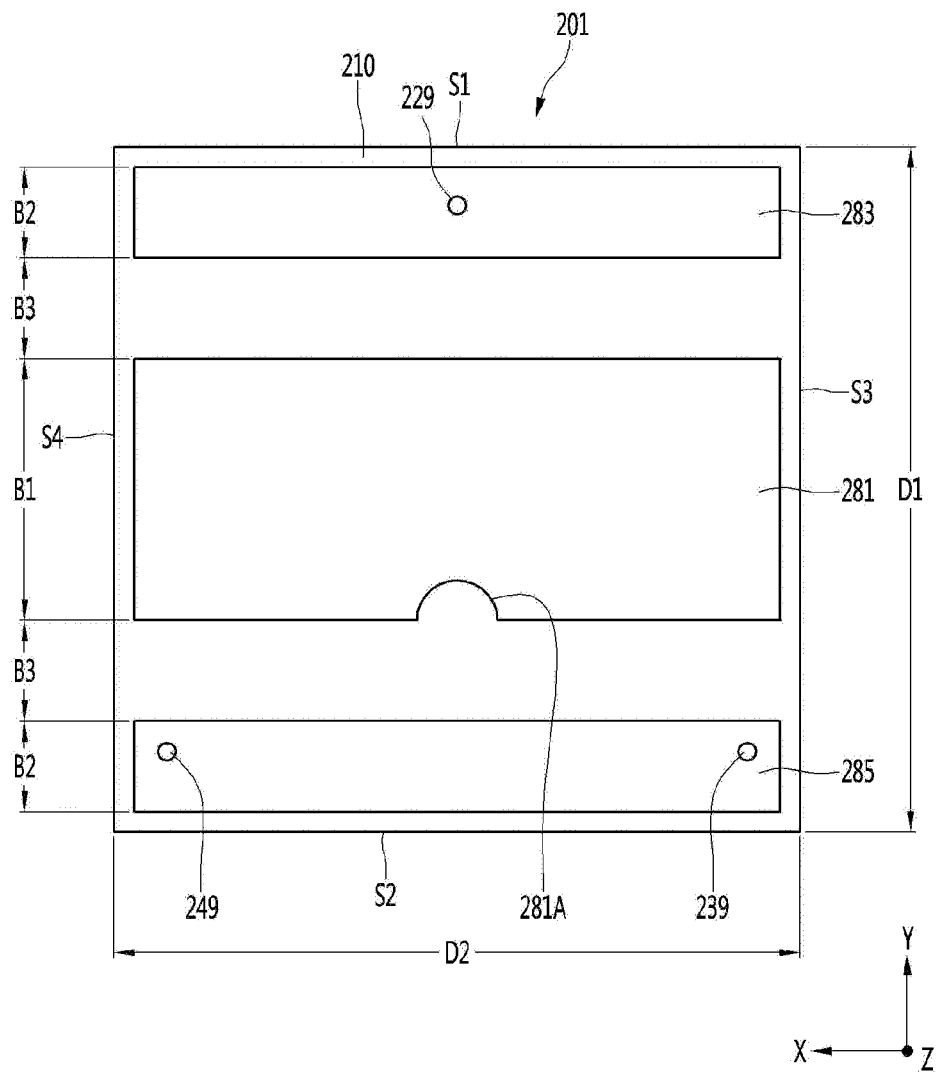

【Figure 5】
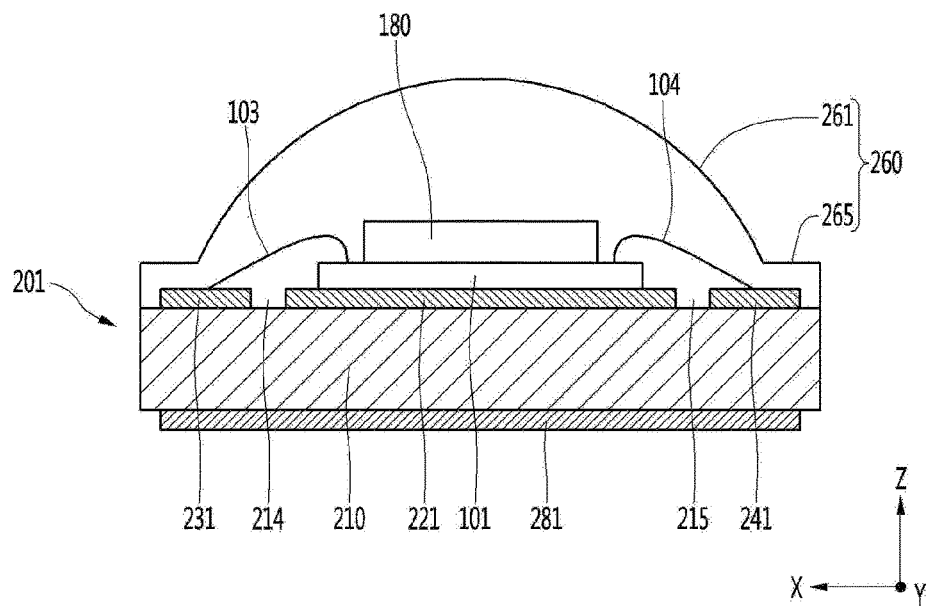
【Figure 6】
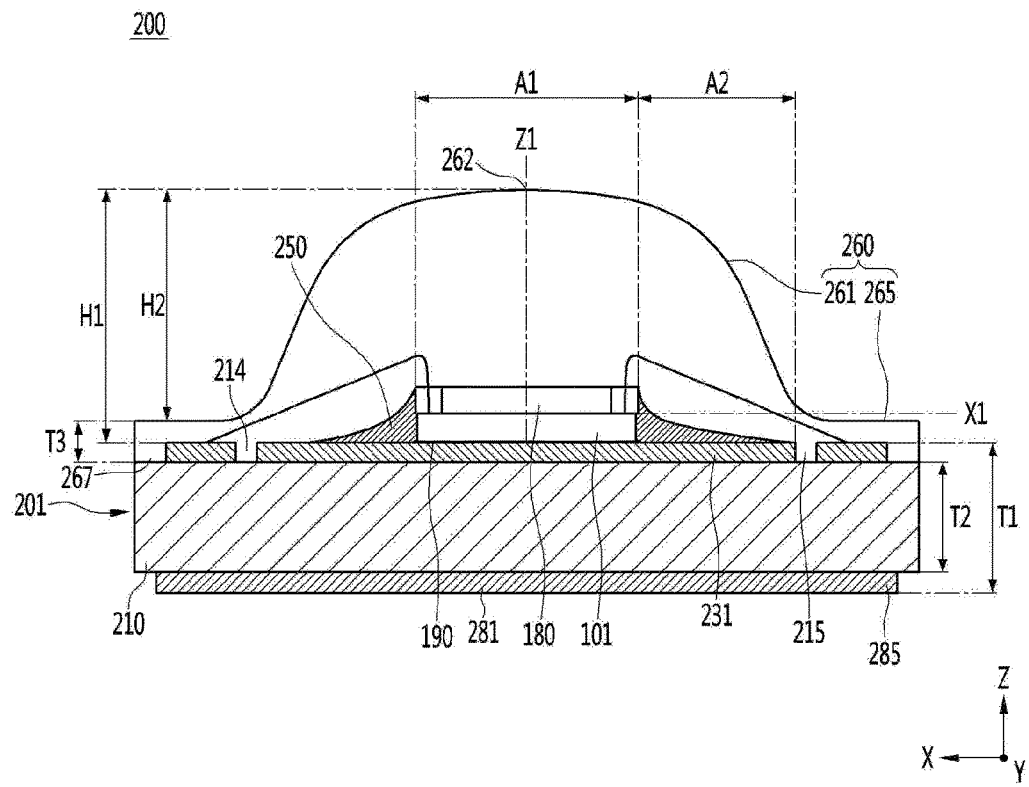

【Figure 7】
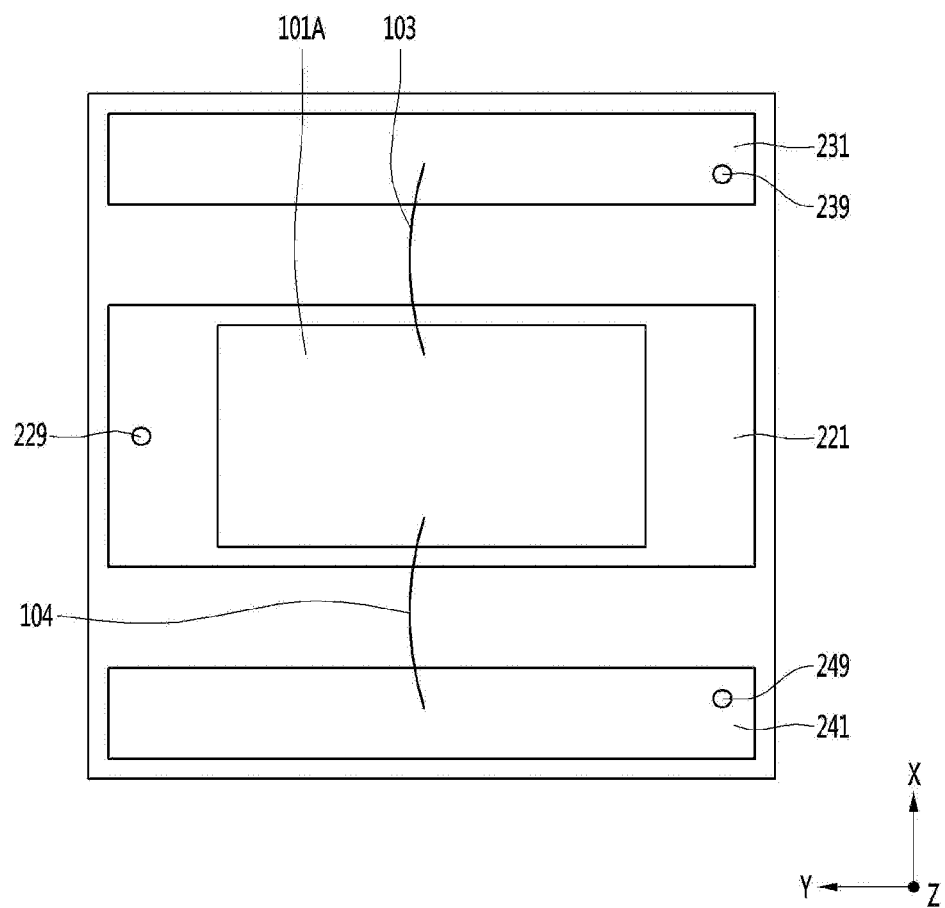

【Figure 8】
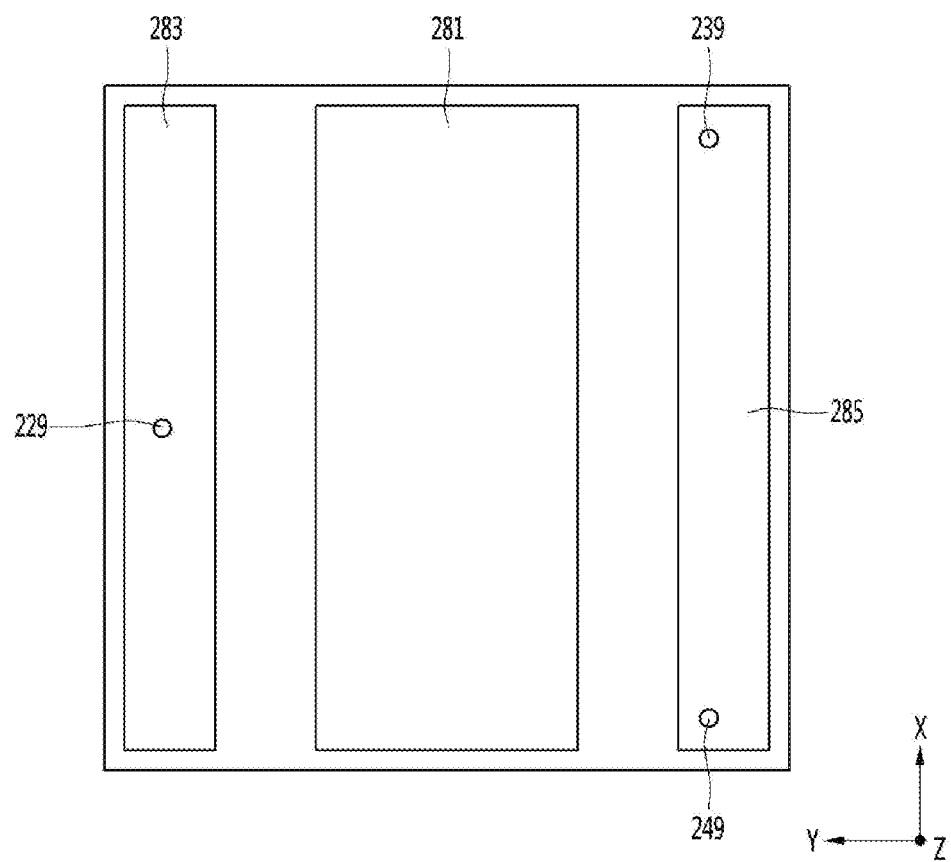

[Figure 9]
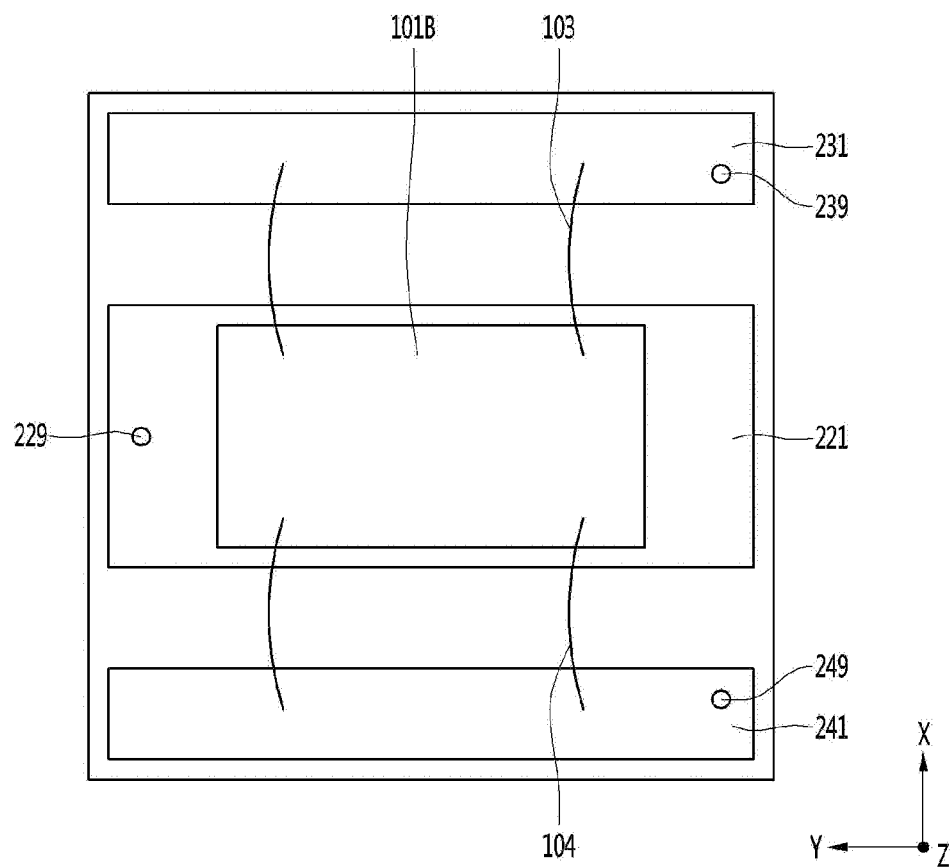

【Figure 10】
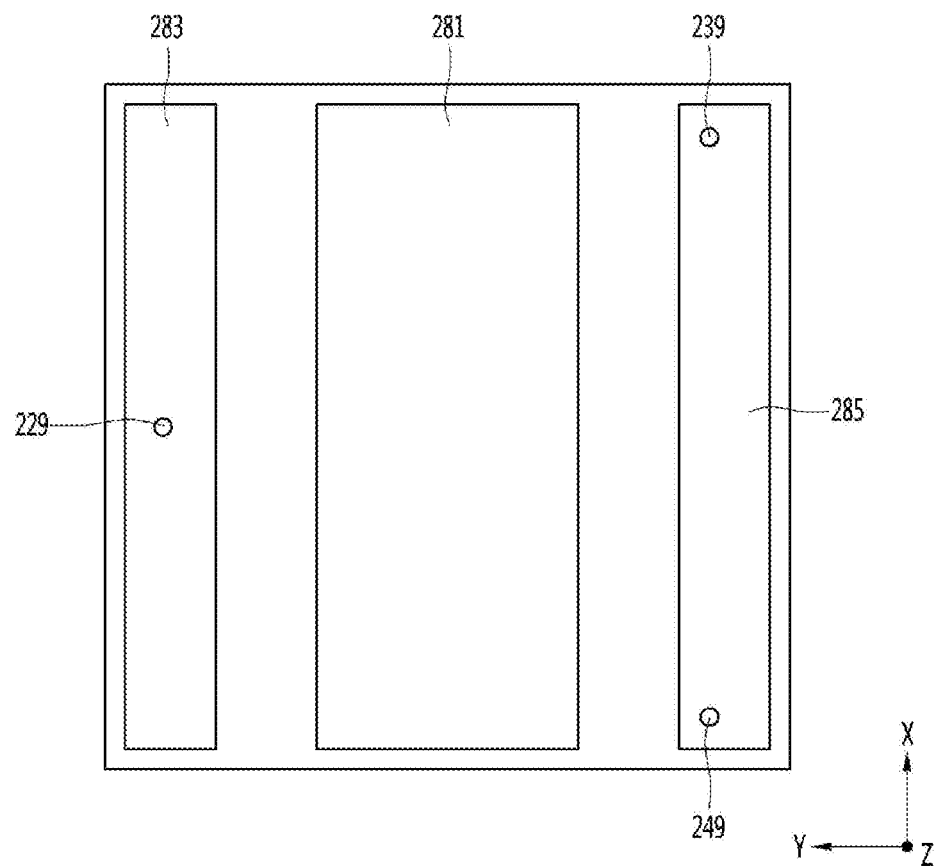

[Figure 11]
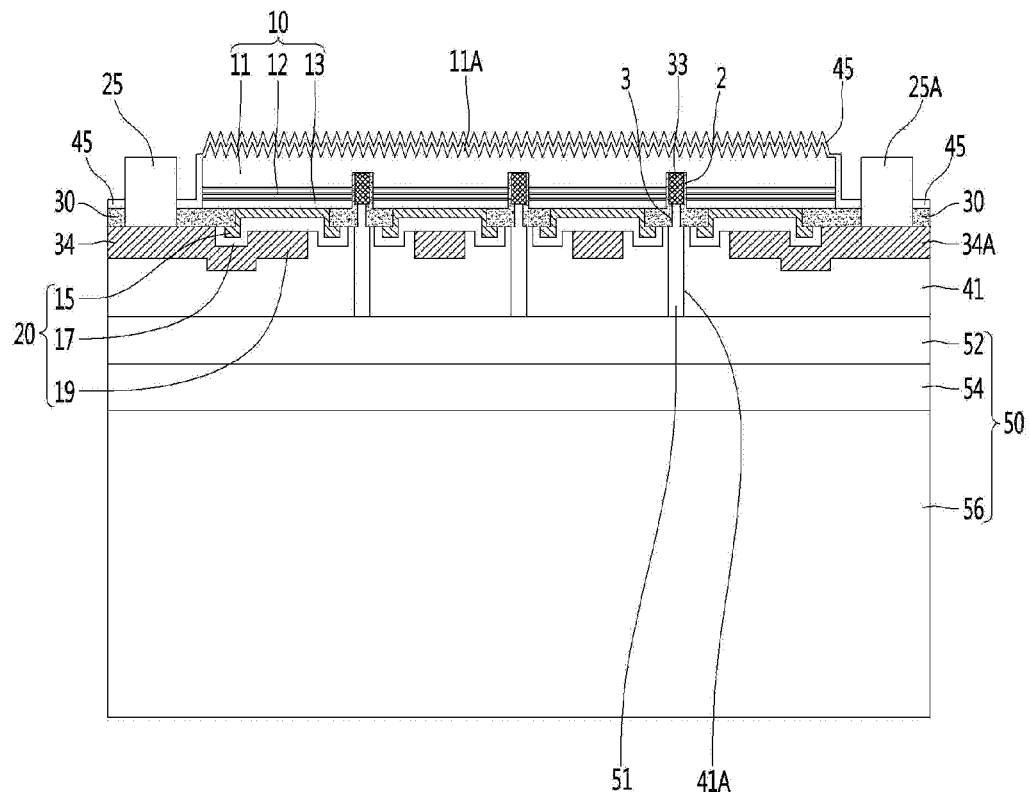
[Figure 12]
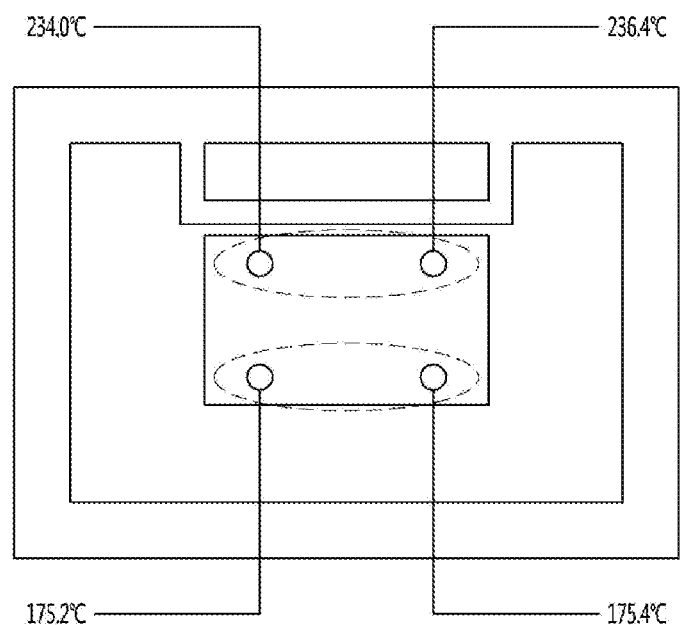

【Figure 13】
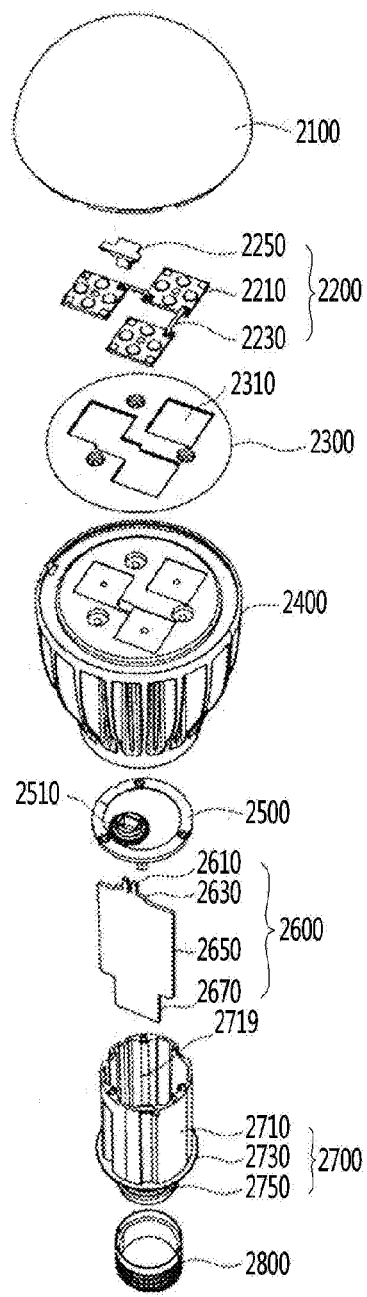

LIGHT EMITTING DEVICE AND LIGHTING DEVICE HAVING SAME

CROSS REFERENCE TO RELATED APPLICATIONS

This application is the National Phase of PCT International Application. No. PCT/KR2016/012857, filed on Nov. 9, 2016, which claims priority under 35 U.S.C. 119(a) to Patent Application No. 10-2015-0157412, filed in Republic of Korea Nov. 10, 2015, all of which are hereby expressly incorporated by reference into the present application.

TECHNICAL FIELD

The present invention relates to a light emitting device and a lighting device having the same.

BACKGROUND ART

A light emitting device, such as a light emitting diode (LED), is a type of semiconductor device that converts electrical energy into light, and has been spotlighted as a next generation light source in place of conventional fluorescent lamps and incandescent lamps.

Since the light emitting diode generates the light by using the semiconductor device, the light emitting diode may represent significantly low power consumption as compared with the glow lamp that generates the light by heating tungsten or the phosphor lamp that generates the light by urging ultraviolet ray, which is generated through the high-voltage discharge, to collide with a phosphor substance.

In addition, since the light emitting diode generates the light by using the potential gap of the semiconductor device, the light emitting diode represents a longer lifespan, a rapider response characteristic, and a more eco-friendly feature as compared with those of a conventional light source.

In this regard, various studies and researches have been performed to substitute the conventional light source with the light emitting diode. The light emitting diode is increasingly used as light sources for lighting devices, such as various lamps used indoors and outdoors, liquid crystal displays, electric signboards, and street lamps.

DISCLOSURE

Technical Problem

The embodiment provides a light emitting device having a large-area light emitting chip on a substrate.

The embodiment provides a light emitting device in which any one electrode of a light emitting chip disposed on a substrate is connected with a plurality of lead electrodes.

The embodiment provides a light emitting device in which a plurality of lead electrodes connected with a plurality of first electrodes of a light emitting chip are disposed to be farther apart from a length of one side of the light emitting chip.

The embodiment provides a light emitting device in which a plurality of lead electrodes disposed on a substrate are arranged perpendicularly to a plurality of lead frames disposed under the substrate.

The embodiment provides a light emitting device in which a reflective member is disposed around a light emitting chip.

The embodiment provides a light emitting device in which a phosphor film is disposed on a light emitting chip and a reflective member is disposed around the phosphor film.

The embodiment provides a light emitting device in which an optical lens having an aspheric lens is disposed on a light emitting chip.

The embodiment provides a light emitting device having an aspheric lens and provided on a light emitting chip/phosphor film disposed on a ceramic substrate.

Technical Solution

According to an embodiment, a light emitting device may include a substrate having a body, a plurality of lead electrodes, which are arranged in a first axis direction on a body, and a heat radiation frame and a plurality of lead frames which are arranged in a second axis direction under the body, and a light emitting chip disposed on a first lead electrode, which is disposed at a central area of the body, among the plurality of lead electrodes and electrically connected with the plurality of lead electrodes. The plurality of lead electrodes may have lengths long in the second axis direction, and the heart radiation frame may be disposed under a central region of the body. The heat radiation frame and the plurality of lead frames may have lengths long in the first axis direction and overlap with the plurality of lead electrodes perpendicularly to the plurality of lead electrodes.

According to an embodiment, a light emitting device may include a substrate having a body, a plurality of lead electrodes, which are arranged in a first axis direction on a body, and a heat radiation frame and a plurality of lead frames which are arranged in a second axis direction under the body, and a light emitting chip disposed on a first lead electrode, which is disposed at a central area of the body, among the plurality of lead electrodes and electrically connected with the plurality of lead electrodes. The plurality of lead electrodes may have lengths long in the second axis direction and the heat radiation frame may be disposed under a central region of the body. The heat radiation frame and the plurality of lead frames may have lengths long in the first axis direction and overlap with the plurality of lead electrodes perpendicularly to the plurality of lead electrodes. The plurality of lead electrodes and the plurality of lead frames may be disposed perpendicularly to each other at opposite sides of the body. The plurality of lead electrodes may include second and third lead electrodes disposed at opposite sides of the first lead electrode and connected with a first electrode of the light emitting chip. A bottom surface area of the light emitting chip may be equal to or greater than 55% of a top surface area of the first lead electrode and may be equal to or greater than 30% of a top surface area of the substrate.

According to an embodiment, the body may be formed of a ceramic material.

According to an embodiment, the light emitting device may further include an optical lens on the substrate. The optical lens may include a lens portion having a curved surface having a convex shape on the light emitting chip, and a buffer portion, which makes contact with the substrate, at a peripheral portion of the light emitting chip.

According to an embodiment, the lens portion may have an aspheric shape.

According to an embodiment, the light emitting device may further include a reflective member at a peripheral portion of the light emitting chip and a phosphor film on the light emitting chip. An upper portion of the reflective member may be provided outside the phosphor film.

According to an embodiment, the plurality of lead electrodes may include second and third lead electrodes arranged in the first axis direction at opposite sides of the first lead electrode, the light emitting chip may have a plurality of first electrodes spaced apart from each other, and the plurality of first electrodes may be connected with the second lead electrode and the third lead electrode.

According to an embodiment, the plurality of lead frames may include a first lead frame electrically connected with the first lead electrode and a second lead frame electrically connected with the second and third lead electrodes. The first and second lead frames may be arranged in the second axis direction at opposite sides of the heat radiation frame.

According to an embodiment, the substrate may include a plurality of connection electrodes provided inside the body. The plurality of connection electrodes may include a first connection electrode connecting the first lead electrode with the first lead frame, a second connection electrode connecting the second lead electrode with the second lead frame, and a third connection electrode connecting the third lead electrode with the second lead frame.

According to an embodiment, the light emitting chip may have a length which is 60% of a length of one side of the substrate.

According to an embodiment, the light emitting device may further include a protective chip disposed on the first lead electrode and electronically connected with the second lead electrode. The protective chip and the first connection electrode may be arranged in the second axis direction. The protective chip and the second and third connection electrodes may be arranged in the first axis direction. A line linking the protective chip to the first connection electrode may be perpendicular to a line linking the protective chip to the second connection electrode.

According to an embodiment, a linear distance between the first connection electrode and the second connection electrode or between the first connection electrode and the third connection electrode may be greater than a length of one side of the light emitting chip.

According to an embodiment, the lens portion may have a maximum diameter equal to a length of the plurality of lead electrodes, which extends in the second axis direction.

According to an embodiment, a second electrode may be disposed under the light emitting chip, a light emitting structure may be disposed on the second electrode, and the plurality of first electrodes may be disposed on the light emitting structure. The second electrode may include a conductive support member, and the plurality of first electrodes may be connected with the second lead electrode and the third lead electrode by wires, respectively.

According to an embodiment, the second lead electrode and the third lead electrode may be cathode terminals.

According to an embodiment, the first lead frame may have a length long in a direction perpendicular to an arrangement direction of the first to third lead electrodes. The second lead frame may have a length long in a direction perpendicular to an arrangement direction of the first to third lead frames. The heat radiation frame may have a length long in a direction perpendicular to the arrangement direction of the first to third lead frames.

According to an embodiment, a bottom surface area of the light emitting chip may be in a range of 40% to 50% of an area occupied by the plurality of lead electrodes.

Advantageous Effects

The embodiment may solve the problem of accumulating a current and heat in the light emitting chip provided inside the light emitting device.

The embodiment may reduce the electrode pattern on the light emitting chip, thereby reducing the light loss due to the electrode pattern.

The embodiment may prevent the wire connected with the light emitting chip from being cracked or de-colored.

The embodiment may provide a light emitting device having an aspheric lens to improve a light orientation angle.

According to the light emitting device of the embodiment, the light extraction efficiency may be improved by disposing the reflective member around the light emitting chip.

According to the embodiment, the light emitting device may improve the light orientation angle by the aspheric lens and the reflective member.

According to the embodiment, the light emitting device may improve tare reliability of the light emitting chip having a large area.

According to the embodiment, the reliability of the light emitting device and the lighting device having the same may be improved.

DESCRIPTION OF DRAWINGS

FIG. 1 is a plan view of a light emitting device according to a first embodiment.

FIG. 2 is a cross-sectional view taken along line A-A of a light emitting device of FIG. 1.

FIG. 3 is a cross-sectional view taken along line B-B of the light emitting device of FIG. 1.

FIG. 4 is an example of a rear view of the light emitting device of FIG. 1.

FIG. 5 is another example of the light emitting device of FIG. 2.

FIG. 6 is a side sectional view of the light emitting device according to the second embodiment.

FIG. 7 is another example of the light emitting device of FIG. 1.

FIG. 8 is an example of a rear view of the light emitting device of FIG. 7.

FIG. 9 is another example of the light emitting device of FIG. 1.

FIG. 10 is an example of a rear view of the light emitting device of FIG. 9.

FIG. 11 is an example of a light emitting chip of the light emitting device according to the embodiment.

FIG. 12 is a view showing a problem in which heat is concentrated in the light emitting device of the comparative example.

FIG. 13 is a perspective view showing a lighting device having a light emitting device according to an embodiment.

BEST MODE

The present embodiments may have various modifications or the combination of several embodiments. The scope of the present invention is not limited to the embodiments to be described below.

The description in a specific embodiment will be understood as that associated with another embodiment unless specified otherwise.

For example, if the feature of element A has been described in the specific embodiment, and the feature of element B has been described in the another embodiment, the combination of the element A and the element B should be understood as falling within the scope of the present invention unless specified otherwise.

In the description of the embodiments, it will be understood that, when one element is referred to as being "on" or "under" another element, it can be "directly" or "indirectly" over the another element, or one or more intervening elements may also be present. In addition, the expression "on or under" may refer to "downward of one element" as well as "upward of the element."

Hereinafter, embodiments of the present invention will be described in detail with reference to accompanying drawings so that those skilled in the art can easily replicate with the embodiments.

Hereinafter, a light emitting device according to an embodiment of the present invention will be described. Although the light emitting device of the embodiment has been described using a Cartesian coordinates system, the light emitting device may be described using another coordinate system. In the Cartesian coordinates system, the X axis, Y axis and Z axis directions shown in the respective drawings are orthogonal to each other, but the embodiment is not limited to this. That is, the X axis, Y axis, and Z axis directions may intersect together without being orthogonal to each other. In the following embodiments, the first axis direction is the X axis direction, the second axis direction is the Y axis direction orthogonal to the X axis direction, and the third axis direction is the Z axis direction orthogonal to the X and Y axis directions.

FIG. 1 is a plan view of a light emitting device according to a first embodiment, FIG. 2 is a cross-sectional view of the light emitting device taken along line AA of FIG. 1, and FIG. 3 illustrates a rear view of the light emitting device of FIG. 1.

Referring to FIGS. 1 to 4, the light emitting device includes a substrate 201, a light emitting chip 101 disposed on the substrate 201, and an optical lens 260 on the light emitting chip 101.

The substrate 201 includes a body 210 and a plurality of lead electrodes 221, 231, and 241 disposed on a top surface of the body 210.

The body 210 includes an insulating material, for example, a ceramic material. The ceramic material includes a low temperature co-fired ceramic (LTCC) or a high temperature co-fired ceramic (HTCC) which is co-fired. The material of the body 210 may be a metal compound such as $Al_2O_3$ or AlN, preferably aluminum nitride (AlN) or alumina ($Al_2O_3$), or a metal oxide having a thermal conductivity of 140 W/mK or more.

For another example, the body 210 may be formed of a resin material such as a resin-based insulating material such as polyphthalamide (PPA). The body 210 may be formed of a thermosetting resin containing silicon, epoxy resin, or plastic material, or a material having high heat resistance and high light resistance. For another example, the body 210 may be optionally doped with an acid anhydride, an antioxidant, a release agent, a light reflector, an inorganic filler, a curing catalyst, a light stabilizer, a lubricant, and a titanium dioxide. The body 210 may be molded by using at least one selected from the group consisting of epoxy resin, modified epoxy resin, silicon resin, modified silicon resin, acrylic resin, and urethane resin. For instance, the body 210 can be formed by using B-stage solid epoxy resin composition, which can be obtained by mixing the epoxy resin, such as triglycidylisocyanurate or hydride bisphenol A diglycidylether, with the acid anhydride promoter, such as hexahydro phthalic anhydride 3-methyl hexahydro phthalic anhydride or 4-methyl hexahydro phthalic anhydride, and then partially hardening the mixture after adding DBU(1.8-Diazabicyclo (5,4,0) undecene-7) serving as a hardening accelerator and ethylene glycol, titanium oxide pigment or glass fiber serving as a promoter to the epoxy resin, but the embodiment is not limited thereto.

The thickness T2 of the body 210 may be in the range of 1 mm or less, for example, 0.45 mm to 0.55 mm. If the thickness is smaller than the above range, there is a problem that the heat radiation efficiency may not be reduced or supported. If the thickness is thicker than the above range, the improvement of the heat radiation efficiency may be slightly represented and thus the thickness T1 of the substrate 201 may be increased.

The length D2 of the substrate 201 which extends in the first axis (X) direction may be the same as or different from the length D1 extending in the second axis (Y) direction. The lengths D1 and D2 of the substrate 201, which extend in the X axis direction and the Y axis direction, may be in a range of 3 mm or more, for example, the range of 3.2 mm to 4 mm. If the width D2 or the length D1 is smaller than the above range, the extraction efficiency of light emitted from the light emitting chip 101 having a large area may be lowered. If the width D2 or the length D1 is larger than the above range, waste of material may be caused. The length D2 of the substrate 201, which extends in the X axis direction, may be an interval between opposite sides S3 and S4 of the side surfaces of the substrate 201. The length D1 of the substrate 201, which extends in the Y axis direction, may be an interval between opposite sides S1 and S2 among the side surfaces of the substrate 201. The sides S3 and S4 may be parallel to each other and perpendicular to other sides S1 and S2.

In this case, regarding the size of the light emitting chip 101, the lengths D5 and D6 of one side are in a range of 2 mm or more, for example, the range of 2.05 mm×2.15 mm. The width D2 or length D1 of the substrate 201 may vary depending on the size of the light emitting chip 101 and the embodiment is not limited thereto.

The light emitting chip 101 may have a polygonal shape, such as a square shape or a rectangular shape, when viewed from the top. The lengths D5 and D6 of sides, which may be equal to each other or may be longer than the other, may be 55% or more, for example, 60% or more of the length D2 or the length D1 of the substrate 201. As the light emitting chip 101 is disposed with an area larger than the area of the top surface of the substrate 201, so that light efficiency by the light emitting chip 101 having a large area may be improved.

The light emitting chip 101 is disposed at the central region on the top surface of the substrate 201 and may be spaced apart from the edge of the substrate 201. The interval between the light emitting chip 101 and the edge of the substrate 201 may be larger than the X-directional widths of the edge-side lead electrodes 231 and 241 extending in the Y axis direction.

Referring to FIGS. 1 and 2, a plurality of lead electrodes 221, 231, and 241 may be disposed on the body 210 of the substrate 201. The plurality of lead electrodes 221, 231, and 241 may include, for example, at least three lead electrodes. The plurality of lead electrodes 221, 231 and 241 include, for example, a first lead electrode 221, a second lead electrode 231 and a third lead electrode 241. The plurality of lead electrodes 221, 231, and 241 may be arranged in the first axis (X) direction and the lengths of the lead electrodes 221, 231, and 241 extends in the second axis (Y) direction.

The first lead electrode 221 may be disposed between the second lead electrode 231 and the third lead electrode 241.

The second lead electrode 231 is adjacent to the third side surface S3 of the substrate 201 and has a long length extending along the third side surface S3. The third lead electrode 241 is adjacent to the fourth side surface S4 and has a long length extending along the fourth side surface S4.

The top surface area of the first lead electrode 221 may be at least three times wider than the top surface area of the third lead electrode 241. The top surface area of the first lead electrode 221 may be wider than the sum of the top surface areas of the second and third lead electrodes 231 and 241. The top surface areas of the second and third lead electrodes 231 and 241 may be different from each other. The top surface area of the second lead electrode 231 may be wider than the top surface area of the third lead electrode 241. The heat radiation area of the first lead electrode 221 may be increased.

The first lead electrode 221 is electrically insulated from the second lead electrode 231 and the third lead electrode 241. The second lead electrode 231 and the third lead electrode 241 may be disposed on opposite sides of the first lead electrode 221. The first lead electrode 221 may be a terminal having a polarity different from those of the second lead electrode 231 and the third lead electrode 241. The second lead electrode 231 and the third lead electrode 241 may be terminals having the same polarity.

When the first lead electrode 221 is an anode terminal, the second lead electrode 231 and the third lead electrode 241 may be the same cathode terminal. When the first lead electrode 221 is a cathode terminal, the second and third lead electrodes 231 and 241 may be anode terminals.

The first lead electrode 221 may be located ate the central region of the body 210 of the substrate 201 and may be disposed between the second lead electrode 231 and the third lead electrode 241. The second and third lead electrodes 231 and 241 may be disposed on both sides of the first lead electrode 221 in the first (X) axis direction. The first, second, and third lead electrodes 221, 231, and 241 may be arranged with lengths extending in the second (Y) axis direction. The first (X) axis directional-length of the first lead electrode 221 may be set in the range of 65% or more, for example, the range of 70% to 75% of the first (X) axis-directional length of the substrate 201. If the first lead electrode 221 is out of the range, it is difficult to secure the interval of the second and third lead electrodes 231 and 241. If the first lead electrode 221 is smaller than the above range, it is difficult to secure the space for arranging the light emitting chip 101 having a large area.

The light emitting chip 101 is disposed at the center region of the top surface region of the substrate 201 and the first lead electrode 221 is disposed between the central region of the top surface of the body 210 and the light emitting chip 101. The light emitting chip 101 may include first electrodes 25 and 25A disposed thereon and the second electrode (not illustrated) under the light emitting chip 101. The first electrodes 25 and 25A and the second electrodes (not shown) may be disposed on opposite sides.

The second axis directional length D3 of the first lead electrode 221 may be equal to those of the second and third lead electrodes 231 and 241. The first lead electrode 221 may be disposed in parallel to the second lead electrode 231 and the third lead electrode 241 in the second (Y) axis direction. The second and third lead electrodes 231 and 241 may be disposed on both sides of the first lead electrode 221 while facing each other, and may be disposed in parallel to the first lead electrode 221 in the second (Y) axis direction.

The light emitting chip 101 is disposed on the first lead electrode 221. A conductive adhesive may electrically connect the first lead electrode 221 with the light emitting chip 101. As the light emitting chip 101 is provided at the lower portion thereof with a second electrode or a second electrode layer, the light emitting chip 101 may be electrically connected with the first lead electrode 221. The first lead electrode 221 may supply power to the second electrode or the second electrode layer of the light emitting chip 101 to improve conduction of heat emitted from the light emitting chip 101.

Since the first lead electrode 221 has an area wider than the sum of top surface areas of the second and third lead electrodes 231 and 241 and is thermally and electrically connected with the light emitting chip 101, the first lead electrode 221 may dissipate heat emitted from the light emitting chip 101 or transfer the heat to the body 210.

The light emitting chip 101 may include first electrodes 25 and 25A, and the first electrodes 25 and 25A may be disposed on or under the light emitting structure of the light emitting chip 101 or may be disposed outside the light emitting structure. A plurality of the first electrodes 25 and 25A may be spaced apart from each other on the light emitting chip 101. The interval between the plurality of first electrodes 25 and 25A may be equal to or greater than ½ of the length D5 and D6 of any one side of the light emitting chip 101. The current spreading effect inside the light emitting chip 101 may be improved due to the interval. Since the plurality of first electrodes 25 and 25A are disposed while being spaced apart from each other, the electrode pattern connected with the first electrodes 25 and 25A may be reduced or eliminated. In the embodiment, the light emitting chip 101 having the plurality of first electrodes 25 and 25A may reduce or eliminate the electrode pattern that may affect the light extraction efficiency. The light extraction efficiency of the light emitting chip 101 may be improved.

The first electrodes 25 and 25A of the light emitting chip 101 may be an anode or a cathode and the second electrode may have the polarity opposite to those of the first electrode 25 and 25A. In other words, the second electrode may be a cathode or an anode. In the light emitting chip 101, the first and second electrodes 25 and 25A and the second electrode may be disposed on the opposite sides.

The light emitting chip 101, which is a lightsource, emits light having a wavelength selected from a wavelength band from ultraviolet to visible light. The light emitting chip 101 includes any one of a UV LED chip, a green LED chip, a block LED chip, or a red LED chip. The light emitting chip 101 may have a thickness of 30 μm or more, for example, a thickness in a range of 50 μm to 180 μm. The thickness of the light emitting chip 101 may vary depending on the lateral-type chip or the vertical-type chip. According to the embodiment, the light emitting chip 101 may be a vertical chip. The thickness of the vertical-type chip may vary depending on the size of the light emitting chip 101, and may be, for example, a chip having a large area such as a length of 1.5 mm or more or 2 mm or more. If the thickness of the LED chip is out of the range, the improvement of the heat radiation efficiency is slightly represented or the chip is bent. The light emitting chip 101 may have a polygonal shape such as a square shape or a rectangular shape when viewed from the top. In addition, the shape of the top view of the light emitting chip 101 may be a circular shape or another polygonal shape, but this disclosure is not limited thereto.

The bottom surface area of the light emitting chip 101 may be 30% or more, for example, be in the range of 35% to 42% of the top surface area of the substrate 201. The bottom surface area of the light emitting chip 101 may be set to be 40% or more, for example, be in the range of 40% to 50% of the area occupied by the first to third lead electrodes 221, 231, and 241. The bottom surface area of the light emitting chip 101 may be set to be 55% or more, for example. 55% to 70% of the top surface area of the first lead electrode 221. The light emitting device according to the embodiment may be provided in a size 1.3 times or more wider than the light emitting chip of the comparative example in which the light emitting chip 101 having a large area has a substrate of the same size. By arranging the first electrodes 25 and 25A in a symmetrical manner on the large-area light emitting chip 101, the current supplied to the light emitting chip 101 is dispersed and the emitted heat is conducted to the first lead electrode 221 and the body 210. In addition, the quantity of light may he increased by the large-area light emitting chip 101.

The first electrodes 25 and 25A of the light emitting chip 101 may be connected with the second lead electrode 231 and the third lead electrodes 231 and 241 by wires 103 and 104, respectively. The linear length of each of the wires 103 and 104 connected with the light emitting chip 101 may be in the range of 0.4 mm or more, for example, 0.5±0.2 mm. The linear length of each of the wires 103 and 104 may vary depending on the substrate size and the thickness of the light emitting chip 101.

Since an interval between the second and third lead electrodes 231 and 241 is greater than the length D5 or D6 of one side S1, S2, S3, and S4 of the light emitting chip 101, the wires 103 and 104 connected with the first electrodes 25 and 25A of the first electrode 101 may supply currents at positions opposite to each other. Accordingly, the wires 103 and 104 connected with the light emitting chip 101 may prevent the current from being centralized in one direction and may disperse the emitted heat. In addition, since the wires 103 and 104 connected with the light emitting chip 101 disperse the current and heat, the bonding portion with the wires 103 and 104 may be prevented from being cracked or the wires 103 and 104 are not prevented from discolored.

As shown in FIG. 12, in the light emitting device of the comparative example, a light emitting chip is disposed on one lead electrode of two lead electrodes and a wire is connected with the other lead electrode. According to such a comparative example, the temperature of the region of the light emitting chip connected with the wire may be higher than the temperature of an opposite region of the light emitting chip by 60° or more. Accordingly, the reliability of the light emitting chip may be degraded and the wire may be cracked or discolored.

A polarity mark may be disposed on any one of the second lead electrode 231 and the third lead electrode 241, for example, the second lead electrode 231. The polarity mark may be disposed on an edge region of the second lead electrode 231 so as to be distinguished from another edge region of the second lead electrode 231. Such a polarity mark may be an anode mark or a cathode mark.

The outer surfaces of the first to third lead electrodes 221, 231 and 241 may be spaced apart from e side surfaces S1, S2, S3, and S4 of the body 210. An edge region of the body 210 may be opened from the lead electrodes 221, 231, and 241.

A protective chip 105 may be disposed on at least one of the first lead electrode 221 and the second lead electrode 231. The protective chip 105 may be disposed on the first lead electrode 221, for example. The protective chip 105 may be disposed between the light emitting chip 101 and the second side S2 of the body 210.

The center of the protective chip 105, the center of the light emitting chip 101, and the connection electrode 229 disposed on the first lead electrode 221 may be aligned on the same straight line. The protective chip 105 may be disposed on the opposite side of the connection electrode 229 with respect to the light emitting chip 101.

The extended part 235 of the second lead electrode 231 extends along a second side S2 of the body 210 adjacent to one side of the light emitting chip 101, for example. The protective chip 105 may be connected with the first lead electrode 221 and may be connected with the extended part 235 of the second lead electrode 231 by a wire 107. The protective chip 105 may be implemented with a thyristor, a zener diode, or a TVS (Transient Voltage Suppression). The protective chip 105 protects the light emitting chip 101 from electrostatic discharge (ESD).

Referring to FIG. 1, the gap portions 214 and 215 are disposed between the first lead electrode 221 and the second electrode 231 and between the first lead electrode 221 and the third lead electrode 241, respectively. The gap portions 214 and 215 may be divided into first and second electrode portions and the first gap portion 214 is disposed between the first lead electrode 221 and the second lead electrode 231, and the second gap portion 215 is disposed between the first lead electrode 221 and the third lead electrode 241. The first and second gap portions 214 and 215 may prevent electrical interference between the lead electrodes 221, 231 and 241. The widths C1 and C2 of the gap portions 214 and 215 may be in the range of 1.2 mm or less, for example, in the range of 0.8 mm to 1.2 mm, and electrical interference may occur if the widths C1 and C2 are smaller than the above range. If the widths C1 and C2 are greater than the above range, the area of each of the lead electrodes 221, 231, and 241 may be reduced. The widths C1 and C2 of the gap portions 214 and 215 may be equal to or different from each other. The widths C1 and C2 of the gap portions 214 and 215 may be distance between the lead electrodes 221 and 231 in the X axis direction and the distance between the lead electrode 231 and 241 in the X axis direction.

The shortest distance between the light emitting chip 101 and the gap portions 214 and 215 may be 0.1 mm or more, for example, may be in the range of 0.1 mm to 0.3 mm. If the light emitting chip 101 is out of this range, the electrical interference, the size of the light emitting chip 101 or the area of the first lead electrode 221 may be reduced.

The distances D3 and D4 between the outermost lines of the first, second, and third lead electrodes 221 and 231 and 241 may be 85% or more, for example, 90% or more of the lengths D1 and D2 of one side of the body 210.

Referring to FIGS. 2 to 4, the substrate 201 may include a plurality of connection electrodes 229, 239 and 249 in the body 210 and a plurality of lead frames 283 and 285 under the body 210.

As illustrated in FIGS. 1 and 4, the plurality of connection electrodes 229, 239, and 249 may include at least one first connection electrode 229 connected with the first lead electrode 221, at least one second connection electrode 239 connected with the second lead electrode 231, and at least one third connection electrode 249 connected with the third lead electrode 241.

The first connection electrode 229 may be disposed adjacent to the first side S1 of the body 210, for example, adjacent to the center region of the first side S1 of the body 210. The first connection electrode 229 is disposed closer to the first side S1 of the body 210 than the light emitting chip 101 to diffuse the current applied through the first connection electrode 229.

The second and third connection electrodes 239 and 249 may be disposed adjacent to the second side S2 opposite to the first side S1 of the body 210. The second and third connection electrodes 239 and 249 may be disposed adjacent to both corner regions of the second side S2 of the body 210. The second and third connection electrodes 239 and 249 may be disposed at positions corresponding to the corners of the light emitting chip 101, respectively. The linear distance between the second and third connection electrodes 239 and 249 may be greater than the length D5 or D6 of any one side of the light emitting chip 101. The linear distance between the first connection electrode 229 and the second connection electrode 239 or the third connection electrode 249 may be greater than the length D5 or D6 of any one side of the light emitting chip 101.

The outer shape of the line segment connecting the first, second, and third connection electrodes 229, 239, and 249 may be a triangular shape, and the second and third connection electrodes 239 and 249 may be disposed outside the lens portion of the optical lens 260. The first, second, and third connection electrodes 229, 239, and 249 may be vertical via electrodes. As illustrated in FIG. 1, the second and third connection electrodes 239 and 249 are disposed at both sides of the protective chip 105 while being provided on a straight line in the X axis direction. The first connection electrode 229 is disposed at both sides of the protective chip 105 while being provided on a straight line in the Y axis direction. The straight line connecting the protective chip 105 and the first connection electrode 229 is perpendicular to the straight line connecting the protective chip 105 and the second connection electrode 239 or the third connection electrode 249. The second and third connection electrodes 239 and 249 may supply currents to different positions due to the distance therebetween and the distance between the second and third connection electrodes 239 and 249 and the first connection electrodes 229.

As shown in FIGS. 1 and 4, the substrate 201 includes a plurality of lead frames 283 and 285, for example, a first lead frame 283 and a second lead frame 285. The first and second lead frames 283 and 285 may have lengths extending in the X axis direction and may be arranged in the Y axis direction. The first and second lead frames 283 and 285 may be arranged in parallel to each other in the X axis direction and may be arranged to have lengths in a direction orthogonal to the Y axis direction.

The first lead frame 283 may be connected with the first connection electrode 229 and the second lead frame 285 may be connected with the second and third connection electrodes 238 and 249. The first connection electrode 229 connected with the first lead frame 283 may be connected with the first lead electrode 221. The second connection electrode 239 connected with the second lead frame 283 is connected with the second lead electrode 231 and the third connection electrode 249 connected with the second lead frame 283 is connected with the electrode 241.

As shown in FIGS. 1 and 3, the first lead frame 283 may be overlapped with the first to third lead electrodes 221, 231, and 241 in the vertical direction Z. The first lead frame 283 may be disposed adjacent to the first side S1 of the body 210 and have a long length extending along the first side S1. The first lead frame 283 may be disposed to overlap the outer regions of the first to third lead electrodes 221, 231, and 241 in the Z axis direction. The first lead frame 283 may be disposed in a direction orthogonal to the Y axis direction in which the second and third lead electrodes 231 and 241 are disposed.

The second lead frame 285 may be overlapped with the first to third lead electrodes 221, 231, and 241 in the Z axis direction. The second lead frame 285 may be disposed adjacent the second side S2 of the body 210 and along the second side S2. The second lead frame 285 may be disposed to overlap the outer regions of the first to third lead electrodes 221, 231, and 241 in the Z axis direction. The second lead frame 285 may be disposed in a direction orthogonal to a direction in which the second and third lead electrodes 231 and 241 are disposed, for example, in a second axis Y direction. The first and second lead frames 283 and 285 may be disposed adjacent to opposite sides S1 and S2 of the body 210 while being parallel to each other. The first and second lead frames 283 and 285 may be arranged in a direction orthogonal to the first, second, and third lead electrodes 221, 231, and 241.

The first lead electrode 221, the second lead electrode 231, the third lead electrode 241, the first lead frame 283, and the second lead frame 285 are formed of at least two of titanium (Ti), copper (Cu), nickel (Ni), gold (Au), chromium (Cr), tantalum (Ta), platinum (Pt), tin (Sn), silver (Ag), and phosphorous (P) and may be formed in multiple layers. Silver (Ag) or aluminum (Ag) is deposited on the surfaces of the first and second lead electrodes 221 and 231 to improve the reflection efficiency of incident light. A gold (Au) layer is formed on the surfaces of the first lead frame 283 and the second lead frame 285 to prevent corrosion by moisture and thus to improve electrical reliability.

The first lead electrode 221, the second lead electrode 231, the third lead electrode 241, the first lead frame 283 and the second lead frame 285 may be formed at a thickness in the range of 85+5 μm. If the thickness is out of the range, the electrical characteristics and thermal conduction characteristics may be deteriorated.

The first, second, and third connection electrodes 229, 239, and 249 may be formed of the same material as the first lead electrode 221, but the present invention is not limited thereto. The linear distances between the first, second, and third connection electrodes 229, 239, and 249 may be at least ½ of the width D2 of the substrate 201, but the present invention is not limited thereto.

A heat radiation frame 281 may be provided under the substrate 201. The heat radiation frame 281 may have a thickness equal to the thicknesses of the first lead frame 283 and the second lead frame 285, and may have an area wider than areas of the first lead frame 283 and the second lead frame 285. The heat radiation frame 281 may be disposed below the central region of the body 210 and the first and second lead frames 283 and 285 may be arranged on both sides of the heat radiation frame 281 in the second axis direction. The heat radiation frame 281 and the first and second lead frames 283 and 285 may have long lengths extending in the first axis direction.

The heat radiation frame 281 may be electrically insulated from the first lead frame 283 and the second lead frame 285. The heat radiation frame 281 may be disposed to overlap with the light emitting chip 101 in the vertical direction (Z). The heat radiation frame 281 may be disposed to overlap with the first lead electrode 221 in the vertical direction. The heat radiation frame 281 may be disposed between the first lead frame 283 and the second lead frame 285. The heat radiation frame 281 may conduct or dissipate heat emitted from the light emitting chip 101. The heat radiation frame 281 may include a polarity mark 281A and the polarity mark 281A may be located in a region corresponding to the second lead frame 285. The polarity mark 281A may indicate the polarity of the second lead frame 285 adjacent to the heat radiation frame 281, but the present invention is not limited thereto. The polarity mark 281A may be a region where a portion of the second lead frame 285 is open. The bottom view shape of the polarity mark 281A may be hemispherical or polygonal shape. The polarity mark 281A may be disposed on the same straight line as the first connection electrode 229 in the Y axis direction.

The length B1 of the heat radiation frame 281 in the Y axis direction may be greater than the length B2 of the first lead frame 283 or the second lead frame 285 in the Y axis direction. The distance B3 between the heat radiation frame 281 and the first or second lead frame 283 and 285 may be a distance in the Y axis direction and may be greater than length B1. The length B1 of the heat radiation frame 281 in the Y axis direction may be twice or more the length B2. The heat radiation frame 281 and the first and second lead frames 283 and 285 may have the same length in the X axis direction.

The heat radiation frame 281 may be arranged in parallel with the first and second lead frames 283 and 285. The heat radiation frame 281 may not overlap the first to third connection electrodes 229, 239 and 249 in the vertical direction. The heat radiation frame 281 may be disposed to overlap the first to third lead electrodes 221, 231, and 241 in the Z axis direction. The length of the heat radiation frame 281 in the X axis direction perpendicular to the first to third lead electrodes 221, 231, and 241 may be longer than the length of the heat radiation frame in the Y axis direction.

Referring to FIGS. 2 and 3, the optical lens 260 is disposed on the substrate 201 to cover the light emitting chip 101. The optical lens 260 may contact the top surface of the light emitting chip 101 and extend to the top surface of the substrate 201. The optical lens 260 may extend to the top surface of the first, second, and third lead electrodes 221, 231, and 241 disposed on the periphery of the light emitting chip 101 and to the top surface of the body 210.

The optical lens 260 may be formed of a transparent resin material such as silicone or epoxy. For another example, the optical lens 260 may be formed of a glass material or a transparent plastic material.

The optical lens 260 includes a lens portion 261 and a buffer portion 265. The lens portion 261 protrudes in an arch shape or hemispherical shape on the light emitting chip 101. The lens portion 261 has a central portion protruding upward. The height H1 of the optical lens 260 may be 1.5 mm or less, for example, in the range of 1.4±0.1 mm. When the height H1 is out of the range, the thickness of the light emitting device may be increased, and the light extraction efficiency may be lowered. The height H2 of the lens portion 261 may be 60% or more, in detail, in a range of 60% to 70% of the height H1 of the optical lens 260. The height H2 of the lens portion 261 may be in the range of 1.3 mm+/−0.05 mm. The height H1 may be less than the lengths D1 or D2 of one side of the substrate 201 and may be 50% or less, for example be in the range of 35% to 50%, of the length D1 or D2. The height H1 may be at least 1.5 times the thickness T1 of the substrate 201, for example, at least 1.8 times. The height H1 of the optical lens 260 may be the distance between the top surface of the lead electrodes 221, 231, and 241 and the apex of the optical lens 260. The height H2 of the lens portion 261 may be a distance between a top surface of the buffer portion 265 and a vertex of the optical lens 260.

The buffer portion 265 of the optical lens 260 is disposed around the light emitting chip 101 and may have a flat top surface. The buffer portion 265 of the optical lens 260 may extend to the outside of the first, second, and third lead electrodes 221, 231, and 241 around the light emitting chip 101. The thickness T3 of the buffer portion 265 may be in the range of 0.15+/−0.05 mm If the thickness T3 is smaller than the above range, it is difficult to prevent moisture penetration. If the thickness T3 is larger than the above range, the light directivity distribution may vary. The buffer portion 265 may contact the top surface of the body 210 in a region where the first, second, and third lead electrodes 221, 231, and 241 of the body 210 are not formed. The outer surface of the buffer portion 265 may be disposed on the same vertical surface as the side surface of the body 210, but the present invention is not limited thereto. The buffer portion 265 may be formed along the outer edge of the body 210 to prevent moisture penetration. The thickness T3 of the buffer portion 265 may be a thickness that may prevent moisture penetration. The thickness T3 of the buffer portion 265 may be an interval between the top surface of the body 210 and the top surface of the buffer portion 265.

Referring to FIGS. 1 and 2, the first connection electrode 229, the wires 103 and 104, and bonding portions between the wires 103 and 104 and the second and third lead electrodes 231 and 241 may be disposed under the region of the lens portion 261 of the optical lens 260. The light emitting chip 101, the protective chip 105, the wire 107 connected with the protective chip 105, and the bonding portion between the second lead electrode 231 and the wire 107 may be disposed under the region of the lens portion 261 of the optical lens. The second and third connection electrodes 239 and 249 may be disposed outside the region for the lens portion 261.

The maximum diameter of the lens portion 261 of the optical lens 260 is arranged to be equal to the length D3 of the first lead electrode 221 in the Y axis direction. Accordingly, on the first lead electrode 221, the light reflection efficiency may be increased and the light extraction efficiency may be improved.

In the light emitting device according to an embodiment, when the uniform optical lens is used, the light emitting chip 101 may be provided with the area wider than the area of a light emitting chip of another light emitting device by 50% or more. In addition, in the light emitting device according to an embodiment, the quantity of light may be increased 50% or more. As the light emitting device according to an embodiment employs wires having the same polarity and connected with opposite sides of the light emitting chip 101, so that the current applied to the light emitting device may be increased by 50% or more.

FIG. 5 is another example of the light emitting device of FIG. 2.

Referring to FIG. 5, the light emitting device includes a substrate 201, a light emitting chip 101 disposed on the substrate 201, a phosphor film 180 disposed on the light emitting chip 101, and an optical lens 260 having a lens portion 261 on the substrate 201.

The lens portion 261 of the optical lens 260 may have a spherical or aspheric shape.

The phosphor film 180 is disposed on the light emitting chip 101 and the portions of the light emitting chip 101 bonded with the wires 103 and 104 may be opened or provided in the form of a hole.

The phosphor film 180 may have an area larger or smaller than a top surface area of the light emitting chip 101. For example, the outer portion of the phosphor film 180 may protrude outward from the side surface of the light emitting chip 101. In this case, the phosphor film 180 may convert the wavelength of light emitted through the side surface of the light emitting chip 101.

The phosphor film 180 absorbs a part of light emitted from the light emitting chip 101 and converts the light into light having a different wavelength. The phosphor film 180 may include a result by adding a phosphor to a transparent resin material, such as silicone or epoxy, and the phosphor may include at least one of a yellow phosphor, a green phosphor, a blue phosphor and a red phosphor. For example, the phosphor may include at least one selected from the group consisting of a nitride based phosphor, an oxy-nitride based phosphor and a sialon based phosphor, which are mainly activated by lanthanoid based elements, such as Eu or Ce; Alkaline-earth halogen apatite phosphor, an alkali earth metal borate halogen phosphor, and an alkali earth metal aluminate phosphor, which are mainly activated by a lanthanoid based element, such as Eu, or a transient metallic element, such as Mn; an alkali earth metal boric acid halogen phosphor; an alkali earth metal aluminate phosphor; an alkali earth silicate; an alkali earth sulfide; an alkali earth thio-gallate; an alkali earth silicon nitride; a germinate; a rare-earth aluminate mainly activated by a lanthanoid based element, such as Ce; a rare-earth silicate; and an organic chelating agent mainly activated by a lanthanoid based element, such as Eu. In detail, the phosphor may be used, but the embodiment is not limited thereto.

The light emitted from the phosphor film 180 and the light emitted from the light emitting chip 101 may be mixed to make white light. The white light may have a color temperature of at least one of Warm white, Cool white, and Neutral white.

The phosphor film 180 may have a thickness different from that of the light emitting chip 101. The phosphor film 180 may be provided in the form of a film. In this case, the top surface and the bottom surface of the phosphor film 180 may be provided in a horizontal plane.

FIG. 6 is a side cross-sectional view of the light emitting device according to the second embodiment. In the following description of the second embodiment, the components the same as those described above will be understood by making reference to the above description.

Referring to FIG. 6, the light emitting device includes a substrate 201, a light emitting chip 101 disposed on the substrate 201, a phosphor film 180 disposed on the light emitting chip 101, a reflective member 250 disposed around the light emitting chip 101 and the phosphor film 180, and an optical lens 260 having an aspheric lens portion 261 on the substrate 201. The configurations of the substrate 201 and the light emitting chip 101 may be understood by making reference to the description of the first embodiment.

The reflective member 250 may be disposed around the light emitting chip 101. The reflective member 250 includes a resin material doped with the metal oxide. The resin material includes silicone or epoxy, the metal oxide is a material having a refractive index higher than that of the resin material, and includes at least one of Al2O3, TIO2, and SiO2. The metal oxide is included in the reflective member 250 in the range of 5 wt % or more, for example, the range of 5 wt % to 30 wt %. The reflective member 250 may have a reflective index of 90% or more with respect to the light emitted from the light emitting chip 101.

The reflective member 250 may be disposed around the phosphor film 180. The reflective member 250 may be in contact with a side surface of the light emitting chip 101 and a side surface of the phosphor film 180. The reflective member 250 may be disposed between the phosphor film 180 and the substrate 201 and may have a width or a thickness which is gradually reduced as the reflective member 250 approaches the top surface of the phosphor film 180.

The upper end of the reflective member 250 may have the same height as that of the top surface of the phosphor film 180 or may have the height lower than that of the top surface of the phosphor film 180. The reflective member 250 reflects light emitted to the side surface of the phosphor film 180.

When the reflective member 250 is dispensed around the light emitting chip 101, the reflective member 250 may extend to the side surface of the phosphor film 180 by capillary phenomenon. A gap may not be formed between the reflective member 250 and the light emitting chip 101 and the phosphor film 180 so that adhesive force may be increased between the reflective member 250 and the light emitting chip 101 and the phosphor film 180.

For another example, a transparent adhesive layer (not shown) may be disposed between the reflective member 250 and the phosphor film 180 and/or between the reflective member 250 and the light emitting chip 101. The transparent adhesive layer may reduce the interface loss caused by the contact between the reflective member 250 and the phosphor film 180 or the interface loss caused by the contact with the side surface of the light emitting chip 101. The transparent adhesive layer may have a triangular shape having a wider upper portion and a narrower lower portion or may have a shape having a curved upper portion.

The optical lens 260 may include the shape of an aspheric lens formed on the substrate 201. The optical lens 260 may be disposed in the shape of an aspheric lens on on the light emitting chip 101 and the phosphor film 180.

The optical lens 260 may be in contact with the top surface of the phosphor film 180 and may extend onto the top surface of the reflective member 250. The optical lens 260 may extend onto the top surface of a body disposed around the reflective member 250.

The optical lens 260 may be formed of a transparent resin material such as silicone or epoxy. For another example, the optical lens 260 may be formed of a glass material or a transparent plastic material.

The optical lens 260 includes a lens portion 261 and a buffer portion 265. The lens portion 261 is disposed on the light emitting chip 101 and the phosphor film 180. The optical lens 260 has the shape of the aspheric lens. The center of the lens portion 261 protrudes upward and the periphery of the center portion of the lens portion 261 may have a gently curved surface. The height H1 of the optical lens 260 may be 1.5 mm or less, for example, 1.4 mm or less. When the height H1 is out of the range, the thickness of the light emitting device may be increased. When the height H1 is smaller than the range, the light extraction efficiency may be lowered.

The lens portion 261 of the optical lens 260 is provided in the form of an aspheric lens so that the height H1 of the optical lens 260 may be reduced and the volume of the optical lens 260 may be reduced. In addition, the periphery of the center 262 of the optical lens 260, that is, the periphery of the high point of the optical lens 260, may have a gently curved surface, and thus may be provided as a total reflection surface reflecting the light incident thereto. Accordingly, the optical lens 260 may improve a luminous flux, may prevent a phenomenon such as a ring shape, and may overcome the color separation phenomenon.

The buffer portion 265 of the optical lens 260 is disposed around the light emitting chip 101 and may have a flat top surface. The buffer portion 265 of the optical lens 260 may extend outward of the top surface of the body 210. An outer portion 267 of the buffer portion 265 may make contact with the top surface of the body 210 in an outer region of the lead electrodes 221, 231, and 241. The outer surface of the buffer portion 265 may be aligned in line with the side surface of the body 210, but the present invention is not limited thereto. The buffer portion 265 may be formed along the outer edge of the body 210 to prevent moisture penetration.

The top surface of the buffer portion 265 may be positioned lower or higher than the line X1 extending from the top surface of the light emitting chip 101. Since light is not emitted to the side surface of the light emitting chip 101,the thickness T3 of the buffer portion 265 may be thin. The top surface of the buffer portion 265 may be disposed lower than the top surface of the phosphor film 180. The top surface of the buffer portion 265 may be disposed at a position lower than the upper end of the reflective member 250.

The optical lens 260 includes a first area A1 overlapping with the light emitting chip 101 in the vertical direction (Z) and a second area A2 overlapping with the reflective member 250 in the vertical direction. The first region A1 may transmit or reflect incident light with a gentle curved surface from the center 262 of the lens portion 261 to the periphery thereof. The second region A2 has a surface sharply curved from the first region A1 to a position adjacent to the side surface of the body 210, and transmits or reflects light incident thereto. The first and second regions A1 and A2 may serve as reflection surfaces to the incident light. The first region A1 may have a gentle curved surface horizontal to the top surface of the light emitting chip 101, and the second region A2 may have a curved surface inclined toward the optical axis (Z1). The lens portion 261 may include the first area A1 and the second area A2.

The optical lens 260 reflects a portion of light by the first region A1 and the second region A2 and the reflected light is incident to the reflective member 250 again so that the travelling path of light may be changed. The light reflected by the reflective member 250 may be diffused through the optical lens 260 and may be provided with a uniform light distribution. Accordingly, the optical lens 260 may provide the lens portion 261 having the form of an aspheric lens, thereby diffusing the emitted light while reducing the height, so that the color separation phenomenon may be reduced.

The optical lens 260 reflects the light incident through the light emitting chip 101 and the phosphor film 180 in the direction of the reflective member 250 by the aspheric shape of the lens portion 261. The light incident on the second lens section 250 may be reflected and emitted through the second outside area A2 of the lens section 261. Accordingly, the light emitted by the optical lens 260 may be emitted with a uniform light distribution. In addition, the amount of light reflected in the lateral direction is increased by the aspheric lens portion 261 of the optical lens 260, thereby overcoming a color ring caused by the light emitted by the optical lens 260.

The light orientation angle of the light emitting device having the optical lens 260 may be formed to be in the range of 125 degrees or more, for example, the range of 125 degrees to 135 degrees, thereby improving the directivity of light. Further, in the light emitting device, the reflective member 250 is disposed around the light emitting chip 101, so the luminous flux may be improved.

FIG. 7 is another example of the light emitting device of FIG. 1, and FIG. 8 is an example of a rear view of the light emitting device of FIG. 7.

Referring to FIGS. 7 and 8, the light emitting device has no protective chip, and includes a first lead electrode 221 on which the light emitting chip 101A is disposed, and second and third lead electrodes 221 and 241 on both sides of the first lead electrode 221. The light emitting chip 101A is connected with the second and third lead electrodes 231 and 241 by wires 103 and 104.

The first, second and third lead electrodes 221, 231 and 241 may be connected with the first and second lead frames 283 and 285 by connection electrodes 229, 239 and 249. The second lead frame 285 may be connected with the second and third lead electrodes 231 and 241 by the connection electrodes 239 and 249.

The first, second, and third lead electrodes 221, 231,and 241 may be arranged in the X axis direction on the substrate, and the first and second lead frames 283 and 285 may be arranged in the Y axis direction under the substrate. Accordingly, the first and second lead frames 283 and 285 may be arranged in a direction perpendicular to the first, second, and third lead electrodes 221, 231, and 241.

The heat radiation frame 281 overlaps with the light emitting chip 101 in the Z axis direction, and may overlap the center region of the first, second, and third lead electrodes 221, 231, and 241 in the Z axis direction. The heat radiation frame 281 may dissipate heat conducted through the first, second, and third lead electrodes 221, 231, and 241.

FIG. 9 is another example of the light emitting device of FIG. 1, and FIG. 10 is an example of a rear view of the light emitting device of FIG. 9.

Referring to FIGS. 9 and 10, the light emitting device includes a vertical light emitting chip 101B, and the light emitting chip 101B may be disposed on a first lead electrode 221, may be electrically connected with the second lead electrode 231 by a plurality of first wires 103, and may be electrically connected with the third lead electrode 241 by a plurality of second wires 104.

The first, second and third lead electrodes 221, 231 and 241 may be connected with the first and second lead frames 283 and 285 by connection electrodes 229, 239 and 249, respectively. The second lead frame 285 may be connected with the second and third lead electrodes 231 and 241 by the connection electrodes 239 and 249.

The first, second, and third lead electrodes 221, 231, and 241 may be arranged in the X axis direction on the substrate, d the first and second lead frames 283 and 285 may be arranged in the Y axis direction under the substrate. Accordingly, the first and second lead frames 283 and 285 may be arranged in a direction perpendicular to the first, second, and third lead electrodes 221, 231, and 241.

The heat radiation frame 281 overlaps with the light emitting chip 101 in the Z axis direction and may overlap with the center region of the first, second, and third lead electrodes 221, 231, and 241 in the Z axis direction. The heat radiation frame 281 may dissipate heat conducted through the first, second, and third lead electrodes 221, 231 and 241.

The first lead electrode 221 has a first polarity and is connected with the light emitting chip 101B. Each of the second and third lead electrodes 231 and 241 may have a second polarity, and may be connected the light emitting chip 101B by the plurality of wires (103, 104).

FIG. 11 is an example of a light emitting chip according to the embodiment.

Referring to FIG. 11, the light emitting chip 101 may include a light emitting structure having a plurality of semiconductor layers 11, 12, and 13, a first electrode layer 20 under the light emitting structure 10, a second electrode layer 50 under the first electrode layer 20, an insulating layer 41 between the first and second electrode layers 20 and 50, and plurality of first electrodes 25 and 25A.

The light emitting structure 10 may include a first semiconductor layer 11, an active layer 12, and a second semiconductor layer 13. The active layer 12 may be disposed between the first and second semiconductor layers 11 and 13. The active layer 12 may be provided under the first semiconductor layer 11, and the second semiconductor layer 13 may be provided under the active layer 12.

For example, the first semiconductor layer 11 may include an n type semiconductor layer doped with a first conductive dopant, for example, an n type dopant, and the second semiconductor layer 13 may include a p type semiconductor layer doped with a second conductive dopant, for example, a p type dopant. In addition, the first semiconductor layer 11 may include the p type semiconductor, and the second semiconductor layer 13 may include the n type semiconductor layer.

A rough unevenness part 11A may be formed on the top surface of the first semiconductor layer 11. The unevenness part 11A may improve the light extraction efficiency. The side sectional view of the unevenness surface 11A may have a polygonal shape, or a semis-spherical shape.

The first electrode layer 20 is disposed between the light emitting structure 10 and the second electrode layer 50, electrically connected with the second semiconductor layer 13 of the light emitting structure 10, and electrically insulated from the second electrode layer 50. The first electrode layer 20 includes a first contact layer 15, a reflective layer 17, and a capping layer 19. The first contact layer 15 is disposed between the reflective layer 17 and the second semiconductor layer 13, and the reflective layer is disposed between the first contact layer 15 and the capping layer 19. The first contact layer 15, the reflective layer 17, and the capping layer 19 may be formed of mutually conductive materials, but the embodiment is not limited thereto.

The first contact layer 15 may make contact with the second semiconductor layer 13, for example, an ohmic contact with the second semiconductor layer 13. The first contact layer 15 may be formed of, for example, a conductive oxide layer, a conductive nitride, or metal. For example, the first contact layer 15 may include at least one of ITO (Indium Tin Oxide), ITON (ITO Nitride), IZO (Indium Zinc Oxide), IZON (IZO Nitride), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, NiO, Pt, Ag, and Ti.

The reflective layer 17 may be electrically connected with the first contact layer 15 and the capping layer 19. The reflective layer 17 reflects light incident therein from the light emitting structure 10 to increase an amount of light to be extracted to the outside.

The reflective layer 17 may be formed of metal having at least 70% of a light reflective index. For example, the reflective layer 17 may be formed of metal including at least one of Ag, Ni, Al, Rh, Pd, Ir, Ru, Mg, Zn, Pt, Cu, Au, and Hf or the alloy thereof. In addition, the reflective layer 17 may be formed in a multi-layer using the metal or the alloy thereof and the transmissive material of ITO (Indium-Tin-Oxide). IZO (Indium-Zinc-Oxide), IZTO (Indium-Zinc-Tin-Oxide), IAZO (Indium-Aluminum-Zinc-Oxide), IGZO (Indium-Gallium-Zinc-Oxide), IGTO (Indium-Gallium-Tin-Oxide), AZO (Aluminum-Zinc-Oxide), or ATO (Antimony-Tin-Oxide). For example, according to the embodiment, the reflective layer 17 may include at least one of Ag, Al, an Ag—Pd—Cu alloy or an Ag—Cu alloy. For example, the reflective layer 17 may be formed by alternately arranging an Ag layer and a Ni layer, and may include Ni/Ag/Ni, a Ti layer or a Pt layer. According to another example, the first contact layer 15 may be formed under the reflective layer 17, and at least a portion of the first contact layer 15 passes through the first reflective layer 17 to make contact with the second semiconductor layer 13. According to another example, the reflective layer 17 may be provided under the first contact layer 15, and a portion of the reflective layer 17 may make contact with the second semiconductor layer 13 through the first adhesive layer 15.

The light emitting device according to the embodiment may include a capping layer 19 provided under the reflective layer 17. The capping layer 19 makes contact with the bottom surface of the reflective layer 17, and the contact parts 34 and 34A is coupled to the first electrodes 25 and 25A to serve as a wire layer to transfer power supplied from the first electrodes 25 and 25A. The capping layer 19 may be formed of metal. For example, the capping layer 19 may include at least one of Cu, Ni, Ti, Ti—W, Cr, W, Pt, V, Fe, and Mo.

The plurality of first electrodes 25 and 25A may include pads and may be disposed outside the light emitting structure 10. As another example, a plurality of second electrodes may be disposed on the outer side of the light emitting structure 10 or on the top surface of the light emitting structure 10.

The contact parts 34 and 34A of the capping layer 19 is provided at a region that is not vertically overlapped with the light emitting structure 10, and perpendicularly overlapped with the first electrodes 25 and 25A. The contact parts 34 and 34A of the capping layer 19 is provided at a region that is not vertically overlapped with the first contact layer 15 and the reflective layer 17. The contact parts 34 and 34A of the capping layer 19 may be provided lower than the light emitting structure 10, and may make direct contact with the first electrodes 25 and 25A.

The first electrodes 25 and 25A may be formed at a single layer or a multi-layer. In the case of the single layer, the first electrodes 25 and 25A may include Au. In the case of the multi-layer, the first electrodes 25 and 25A may include at least two of Ti, Ag, Cu, and Au. In this case of the multi-layer, the first electrodes 25 and 25A may the stack structure of Ti/Ag/Cu/Au or Ti/Cu/Au. At least one of the reflective layer 17 and the first contact layer 15 may make directly contact with the first electrodes 25 and 25A, but the embodiment is not limited thereto.

The first electrodes 25 and 25A may be provided at a region A1 between an outer sidewall of the first electrode layer 20 and the light emitting structure 10. The protective layer 30 and the transmissive layer 45 may make contact with a peripheral portion of the first electrodes 25 and 25A.

The protective layer 30 may be provided on the bottom surface of the light emitting structure 10, may make contact with the bottom surface of the second semiconductor layer 13 and the first contact layer 15, and may make contact with the reflective layer 17.

An inner portion of the protective layer 30 vertically overlapped with the light emitting structure 10 may be vertically overlapped with the region for the protrusion 16. An outer portion of the protective layer 30 extends onto the contact parts 34 and 34A of the capping layer 19, and is vertically overlapped with the contact parts 34 and 34A. The outer portion of the protective layer 30 may make contact with the first electrodes 25 and 25A, for example, may be provided at surrounding surfaces of the first electrodes 25 and 25A.

The inner portion of the protective layer 30 may be disposed between the light emitting structure 10 and the first electrode layer 20, and an outer portion of the protective layer 30 may be disposed between the transmissive layer 45 and the capping layer 19. The outer portion of the protective layer 30 extends to an outer region A1 from the sidewall of the light emitting structure 10 to prevent moisture from being infiltrated into the light emitting device.

The protective layer 30 may be defined as a channel layer, a low-reflective-index material, or an isolation layer. The protective layer 30 may be realized with an insulating material, for example, an oxide or a nitride. For example, the protective layer 30 may include at least one selected from the group consisting of $SiO_2$, $SixOy$, $Si_3N_4$, $SixNy$, $SiOxXNy$, $Al_2O_3$, $TiO_2$, and AlN. The protective layer may be formed of a transparent material.

The light emitting device according to the embodiment may include an insulating layer 41 to electrically insulate the first electrode layer 20 from the second electrode layer 50. The insulating layer 41 may be disposed between the first electrode layer 20 and the second electrode layer 50. The protective layer 30 may make contact with the upper portion of the insulating layer 41. The insulating layer 41 may be realized with, for example, an oxide or a nitride. For example, the insulating layer 41 may be formed of at least one selected from the group consisting of $SiO_2$, $SixOy$, $Si_3N_4$, $SixNy$, $SiOxNy$, $Al_2O_3$, $TiO_2$, and AlN.

The insulating layer 41 may have the thickness in the range of 100 nm to 2000 nm. If the insulating layer 41 is formed with the thickness of less than 100 nm, a problem may occur in the insulating property. If the insulating layer 41 is formed with the thickness exceeding 2000 nm, the insulating layer 41 may be broken in the subsequent process. The insulating layer 41 may make contact with the top surface of the first electrode layer 20 and the top surface of the second electrode layer 50, and may be formed with a thickness thicker than that of each of the protective layer 30, the capping layer 19, the contact layer 15, and the reflective layer 17.

The second electrode layer 50 may include an anti-spread layer 52 provided under the insulating layer 41, a bonding layer 54 provided under the anti-spread layer 52, and a conductive support member 56 provided under the bonding layer 54, and may be electrically connected with the first semiconductor layer 11. In addition, the second electrode layer 50 includes one or two selected from among the anti-spread layer 52, the bonding layer 54, and the conductive support member 56, and at least one of the diffusion barrier layer 52 and the bonding layer 54 may not be formed.

The diffusion barrier layer 52 may include at least one of Cu, Ni, Ti, Ti—W, Cr, W, Pt, V, Fe, and Mo. The diffusion barrier layer 52 may function as a diffusion barrier layer between the insulating layer 41 and the bonding layer 54. The diffusion barrier layer 52 may be electrically connected with the bonding layer 54 and the conductive support member 56, and electrically connected with the first semiconductor layer 11.

The diffusion barrier layer 52 may prevent a material container in the bonding layer 54 from being spread toward the reflective layer 17 in the process of providing the bonding layer 54. The diffusion barrier layer 52 may prevent tin (Sn) contained in the bonding layer 54 from affecting the reflecting layer 17.

The bonding layer 56 may include barrier metal or bonding metal. For example, the bonding layer 56 may include at least one of Ti, Au, Sn, Ni, Cr, Ga, In, Bi, Cu, Ag, Nb, Pd and Ta. The conductive support member 56 may support the light emitting structure 10 according to the embodiment to serve as a heat radiation function. The bonding layer 54 may include a seed layer.

The conductive support member 56 may be formed of at least one of a metallic substrate, or a carrier substrate. The conductive support member 56 may include at least one of semiconductor substrates doped with Ti, Cr, Ni, Al, Pt, Au, W, Cu, Mo, Cu-W and impurities (Si, Ge, GaN, GaAs, ZnO, SiC, or SiGe). The conductive support member 56 is a layer to support the light emitting chip 101, and may have the thickness corresponding to 80% or more of the thickness of the second electrode layer 50, that is, the thickness of at least 30 μm.

Meanwhile, the second contact layer 33 is provided in the first semiconductor layer 11, and makes contact with the first semiconductor layer 11. The top surface of the second contact layer 33 may be provided above the bottom surface of the first semiconductor layer 11, electrically connected with the first semiconductor layer 11, and insulated from the active layer 12 and the second semiconductor layer 13.

The second contact layer 33 may be electrically connected with the second electrode layer 50. The second contact layer 33 may be provided through the first electrode layer 20, the active layer 12, and the second semiconductor layer 13. The second contact layer 33 is provided in a recess 2 in the light emitting structure 10, and insulated from the active layer 12 and the second semiconductor layer 13 through the protective layer 30. A plurality of second contact layers 33 may be spaced apart from each other.

The second contact layer 33 may be connected with the protrusion 51 of the second electrode layer 50, and the protrusion 51 may protrude from the diffusion barrier layer 52. The protrusion 51 may pass through 41A formed in the protective layer 30 and the insulating layer 41, and may be insulated from the first electrode layer 20.

The second contact layer 33 may include at least one of, for example, Cr, V, W, Ti, Zn, Ni, Cu, Al, Au, and Mo. According to another example, the protrusion 51 may include at least one material constituting the diffusion barrier layer 52 and the bonding layer 54, but the embodiment is not limited thereto. For example, the protrusion 51 may include at least one of Ti, Au, Sn, Ni, Cr, Ga, In, Bi, Cu, Ag, Nb, Pd, and Ta.

The first electrodes 25 and may be electrically connected with the first electrode layer 20, and exposed to a region A1 outside sidewall of the light emitting structure 10. One or a plurality of pads 25 may be provided. The first electrodes 25 and 25A may include at least one of Cu, Ni, Ti, Ti—W, Cr, W, Pt, V, Fe, and Mo.

The transmissive layer 45 may protect the surface of the light emitting structure 10 and insulate the first electrodes 25 and 25A from the light emitting structure 10. The transmissive layer 45 may make contact with a peripheral portion of the protective layer 30. The transmissive layer 45 may have a refractive index lower than that of a semiconductor layer material constituting the light emitting structure 10 to improve the light extraction efficiency. The transmissive layer 45 may be realized with an oxide or a nitride. For example, the transmissive layer 45 may be formed of at least one selected from the group consisting of $SiO_2$, $SixOy$, $Si_3N_4$, $SixNy$, $SiOxNy$, $Al_2O_3$, $TiO_2$, and AlN. Meanwhile, the transmissive layer 45 may be omitted depending on designs. According to the embodiment, the light emitting structure 10 may be driven by the first electrode layer 20 and the second electrode layer 50.

As another example, if an electrode having a pad and an electrode pattern connected thereto is disposed on the first semiconductor layer 11, an electrode layer may be disposed below the light emitting structure 10 as a reflective layer and a conductive support member. It is not limited.

The light source module of the above-described embodiment (s) may be provided in a lighting system such as a light unit The light source module may include at least one of a light guide plate, a diffusion sheet, and a prism sheet in a light output area. The lighting system may be a lighting lamp, a traffic light, a vehicle headlight, or a billboard.

<Lighting System>

The light emitting device according to the embodiment can be applied to a lighting system. The lighting system includes a structure in which a plurality of light emitting devices are arrayed. The lighting system includes the lighting apparatus shown in FIG. 13, and may include a lighting lamp, a signal lamp, a vehicle headlight, an electric sign board, and the like.

FIG. 13 is an exploded perspective view showing a display device having the light emitting device according to the embodiment.

Referring to FIG. 13, the lighting device according to the embodiment may include a cover 2100, a light source module 2200, a heat radiation member 2400, a power supply part 2600, an inner case 2700, and a socket 2800. In addition, the light emitting device according to the embodiment may further include at least one of a member 2300 and a holder 2500. The light source module 2200 may include the light emitting device or the light emitting device package according to the embodiment.

For example, the cover 2100 has the shape of a bulb, or a hemispherical shape. The cover 2100 may have a hollow structure, and a portion of the cover 2100 may be open. The cover 2100 may be optically connected to the light source module 2200, and may be coupled with the heat radiation member 2400. The cover 2100 may have a recess part coupled with the heat radiation member 2400.

The inner surface of the cover 2100 may be coated with ivory white pigments serving as a diffusing agent. The light emitted from the light source module 2200 may be scattered or diffused by using the ivory white material, so that the light can be discharged to the outside.

The cover 2100 may include glass, plastic, PP, PE, or PC. In this case, the PC represents superior light resistance, superior heat resistance, and superior strength. The cover 2100 may be transparent so that the light source module 2200 may be recognized at the outside. In addition, the cover 2100 may be opaque. The cover 2100 may be formed through a blow molding scheme.

The light source module 2200 may be disposed at one surface of the heat radiation member 2400. Accordingly, the heat emitted from the light source module 2200 is conducted to the heat radiation member 2400. The light source module 2200 may include a light emitting device 2210, a connection plate 2230, and a connector 2250.

The member 2300 is disposed on the top surface of the heat radiation member 2400, and has a guide groove 2310 having a plurality of light emitting devices 2210 and a connector 2250 inserted into the guide groove 2310. The guide groove 2310 corresponds to the substrate of the light emitting device 2210 and the connector 2250.

White pigments may be applied to or coated on the surface of the member 2300. The member 2300 reflects light, which reflected by the inner surface of the cover 2100 to return to the light source module 2200, toward the cover 2100. Accordingly, the light efficiency of the lighting apparatus according to the embodiment can be improved.

The member 2300 may include an insulating material. The connection plate 2230 of the light source module 2200 may include an electric-conductive material. Accordingly, the heat radiation member 2400 may be electrically connected to the connection plate 2230. The member 2300 includes an insulating material to prevent the electrical short between the connection plate 2230 and the heat radiation member 2400. The heat radiation member 2400 receives heat from the light source module 2200 and the heat from the power supply part 2600 and radiates the heats.

The holder 2500 blocks a receiving groove 2719 of an insulating part 2710 disposed in all internal case 2700. Accordingly, the power supply part 2600 received in the insulating part 2710 of the internal case 2700 is sealed. The holder 2500 has a guide protrusion part 2510. The guide protrusion part 2510 may include a hole allowing a protrusion part 2610 of the power supply part 2600 to pass therethrough.

The power supply part 2600 processes and transforms an electrical signal received from the outside and supplies the electrical signal to the light source module 2200. The power supply part 2600 is received in the receiving groove 2719 of the internal case 2700, and sealed in the internal case 2700 by the holder 2500. A supporting portion 2730 of the internal case 2700 supports a lower portion of the heat radiation member 2400.

The power supply part 2600 may include a protrusion part 2610, a guide part 2630, a base 2650, and an extension part 2670.

The guide part 2630 protrudes outward from one side of the base 2650. The guide part 2630 may be inserted into the holder 2500. A plurality of parts may be disposed on one surface of the base 250. For example, the parts include a DC converter, a driving chip to drive the light source module 220, and an ESD (electrostatic discharge) protective device to protect the light source module 2200, but the embodiment is not limited thereto.

The extension part 2670 protrudes outward from another side of the base 2650. The extension part 2670 is inserted into the connection part 2750 of the internal case 2700, and receives an electrical signal from the outside. For example, the extension part 2670 may be equal to or less than the width of the connection part 2750 of the internal case 2700. The extension part 2670 may be electrically connected to the socket 2800 through a wire.

The internal case 2700 may be disposed therein with a molding part together with the power supply part 2600. The molding part is formed by hardening a molding liquid, so that the power supply part 2600 may be fixed into the internal case 2700.

The above description is not to be taken in a limiting sense, but is formed merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

While the present invention has been described with reference to exemplary embodiments, it is to be understood that the invention is not limited to the disclosed exemplar embodiments. It will be apparent to those skilled in the art that various modifications and variations can be made in the present invention without departing from the spirit or scope of the invention. It can be seen that various modifications and applications are possible. For example, each component specifically shown in the embodiments can be modified and implemented. It is to be understood that the present invention is not limited to the above-described embodiments, and variations and modifications may be made without departing from the scope of the present invention.

INDUSTRIAL APPLICABILITY

The embodiment may provide a packaged light emitting device having a large-area light emitting chip.

The embodiment may provide a light emitting device including a large-area light emitting chip having an improved heat radiation characteristic.

The embodiment may provide a light emitting device including a large-area light emitting chip having improved light distribution.

The embodiment may provide a light emitting device having an improved orientation angle of light.

According to the embodiment, the light emitting device is applicable to various types of display devices.

According to the embodiment, the light emitting device may be used for various lighting systems, such as a lighting lamp, a traffic light, a vehicle headlight, and an electric signboard.

The invention claimed is:

1. A light emitting device comprising:
a substrate having a body, a plurality of lead electrodes, which are arranged in a first axis direction on the body, and a heat radiation frame and a plurality of lead frames which are arranged in a second axis direction under the body; and
a light emitting chip disposed on a first lead electrode, which is disposed at a central area of the body, among the plurality of lead electrodes and electrically connected with the plurality of lead electrodes,
wherein the plurality of lead electrodes have lengths long in the second axis direction,
wherein the heat radiation frame is disposed under a central region of the body,
wherein the heat radiation frame and the plurality of lead frames have lengths long in the first axis direction and overlap the plurality of lead electrodes perpendicularly to the plurality of lead electrodes,
wherein the plurality of lead electrodes include a second lead electrode and a third lead electrode arranged in the first axis direction at opposite sides of the first lead electrode,
wherein the light emitting chip has a plurality of first electrodes spaced apart from each other,
wherein the plurality of first electrodes are connected with the second lead electrode and the third lead electrode,
wherein the plurality of lead frames include a first lead frame electrically connected with the first lead electrode and a second lead frame electrically connected with the second lead electrode and the third lead electrode,
wherein the first lead frame and the second lead frame are arranged in the second axis direction at opposite sides of the heat radiation frame,
wherein the substrate includes a plurality of connection electrodes provided inside the body,
wherein the plurality of connection electrodes include a first connection electrode connecting the first lead electrode with the first lead frame, a second connection electrode connecting the second lead electrode with the second lead frame and a third connection electrode connecting the third lead electrode with the second lead frame,
further comprising a protective chip disposed on the first lead electrode and electronically connected with the second lead electrode,
wherein the protective chip and the first connection electrode are arranged in the second axis direction, and
wherein the protective chip, the second connection electrode and the third connection electrode are arranged in the first axis direction.

2. The light emitting device of claim 1, wherein the body is formed of a ceramic material.

3. The light emitting device of claim 1, further comprising: an optical lens on the substrate,
wherein the optical lens includes: a lens portion having a curved surface having a convex shape on the light emitting chip; and a buffer portion, which makes contact with the substrate, at a peripheral portion of the light emitting chip.

4. The light emitting device of claim 3, wherein the lens portion has an aspheric shape.

5. The light emitting device of claim 3, further comprising: a reflective member at the peripheral portion of the light emitting chip; and a phosphor film on the light emitting chip,
wherein an upper portion of the reflective member is provided outside the phosphor film.

6. The light emitting device of claim 5, wherein the reflective member contacts a side surface of the phosphor film, and
wherein the reflective member includes a resin material.

7. The light emitting device of claim 5, wherein the reflective member contacts a side surface of the light emitting chip, and
wherein the reflective member includes a resin material.

8. The light emitting device of claim 3, wherein the lens portion has a maximum diameter equal to a length of the plurality of lead electrodes, which extends in the second axis direction.

9. The light emitting device of claim 1, wherein the light emitting chip has a length which is 60% of a length of one side of the substrate.

10. The light emitting device of claim 1, wherein a line linking the protective chip to the first connection electrode is perpendicular to a line linking the protective chip to the second connection electrode.

11. The light emitting device of claim 1, wherein a linear distance between the first connection electrode and the second connection electrode or between the first connection electrode and the third connection electrode is greater than a length of one side of the light emitting chip.

12. The light emitting device of claim 1, wherein the light emitting chip includes a second electrode on the first electrode and a light emitting structure is disposed on the second electrode, and the plurality of first electrodes are disposed on the light emitting structure,
wherein the second electrode includes a conductive support member, and
wherein the plurality of first electrodes are connected with the second lead electrode and the third lead electrode by wires, respectively.

13. The light emitting device of claim 12, wherein the second lead electrode and the third lead electrode are cathode terminals.

14. The light emitting device of claim 1, wherein the first lead frame has a length long in the first axis direction,
  wherein the second lead frame has a length long in the first axis direction, and
  wherein the heat radiation frame has a length long in the first axis direction.

15. The light emitting device of claim 1,
  wherein a bottom surface area of the light emitting chip is equal to or greater than 55% of a top surface area of the first lead electrode and is equal to or greater than 30% of a top surface area of the substrate.

16. The light emitting device of claim 15, wherein the light emitting chip has a length which is equal to or greater than 60% of a length of one side of the substrate, and
  wherein the bottom surface area of the light emitting chip is in a range of 40% to 50% of an area occupied by the plurality of lead electrodes.

17. The light emitting device of claim 16, further comprising: an optical lens on the substrate,
  wherein the optical lens includes: a lens portion having a curved surface having a convex shape disposed on the light emitting chip; and a buffer portion making contact with the substrate and the lead electrodes, around the light emitting chip, and
  wherein the optical lens has a height which is equal to or less than 50% of a length of one side surface of the substrate.

* * * * *